United States Patent
Khalilinia

(10) Patent No.: US 12,057,706 B2
(45) Date of Patent: *Aug. 6, 2024

(54) WIRELESS POWER TRANSFER SYSTEM WITH OPEN LOOP REACTANCE MATCHING CIRCUITRY

(71) Applicant: Glowolt Inc., San Mateo, CA (US)

(72) Inventor: Hamed Khalilinia, San Mateo, CA (US)

(73) Assignee: Glowolt Inc., Napa, CA (US)

( * ) Notice: Subject to any disclaimer, the term of this patent is extended or adjusted under 35 U.S.C. 154(b) by 405 days.

This patent is subject to a terminal disclaimer.

(21) Appl. No.: 17/380,615

(22) Filed: Jul. 20, 2021

(65) Prior Publication Data

US 2021/0351618 A1    Nov. 11, 2021

Related U.S. Application Data

(63) Continuation of application No. 16/948,868, filed on Oct. 3, 2020, now Pat. No. 11,101,693.

(60) Provisional application No. 62/909,854, filed on Oct. 3, 2019.

(51) Int. Cl.
   H02J 50/05    (2016.01)
   H01F 38/14    (2006.01)
   (Continued)

(52) U.S. Cl.
   CPC .............. H02J 50/05 (2016.02); H01F 38/14 (2013.01); H02J 50/12 (2016.02); H02J 50/40 (2016.02);
   (Continued)

(58) Field of Classification Search
   CPC .. H02J 50/05; H02J 50/12; H02J 50/40; H02J 50/005; H02J 50/402; H01F 38/14;
   (Continued)

(56) References Cited

U.S. PATENT DOCUMENTS 7,317,374 B2 * 1/2008 Flanders ............... H01F 29/146
                                                        336/182
7,498,922 B2 * 3/2009 Flanders ................... H01F 3/14
                                                        336/182
(Continued)

FOREIGN PATENT DOCUMENTS

DE    102012205737 A1    10/2014
JP      2016149650 A      8/2016
(Continued)

*Primary Examiner* — Jared Fureman
*Assistant Examiner* — Michael J Warmflash
(74) *Attorney, Agent, or Firm* — Adibi IP Group, PC; Amir V. Adibi; Andrew C. Palmer

(57) ABSTRACT

A system includes a power source, a transmitter circuit, a conductor, and a receiver circuit. The transmitter circuit is supplied by the power source and wirelessly supplies the receiver circuit via the conductor. The conductor includes a plurality of distributed capacitances coupled in series with the conductor. The receiver circuit includes a primary coil and a secondary coil. The primary coil has at least two turns and includes a plurality of distributed capacitances. The transmitter circuit includes an Open Loop Reactance Matching (OLRM) control circuit, a first inverter, a second inverter, and a third inverter. The OLRM control circuit controls the first inverter to generate a high frequency AC voltage to be supplied to the conductor. During wireless power transfer, the OLRM control circuit performs reactance matching by controlling the second and third inverters to maintain the transmitter voltage and current in phase without requiring any feedback sensing.

24 Claims, 20 Drawing Sheets

TRANSMITTER CIRCUIT OF A WIRELESS POWER TRANSFER SYSTEM

(51) Int. Cl.
  *H02J 50/12* (2016.01)
  *H02J 50/40* (2016.01)
  *H02M 7/5387* (2007.01)
  *H03H 11/28* (2006.01)
  *H01F 27/24* (2006.01)
  *H03F 3/21* (2006.01)

(52) U.S. Cl.
  CPC ........ *H02M 7/53871* (2013.01); *H03H 11/28* (2013.01); *H01F 27/24* (2013.01); *H03F 3/21* (2013.01)

(58) Field of Classification Search
  CPC . H01F 27/24; H02M 7/53871; H02M 7/4835; H03H 11/28; H03F 3/21
  See application file for complete search history.

(56) References Cited

U.S. PATENT DOCUMENTS

| | | | |
|---|---|---|---|
| 7,909,483 B2 | 3/2011 | Jacobs et al. | H05B 45/00 362/276 |
| 8,970,060 B2 | 3/2015 | Ichikawa et al. | B60L 53/122 307/10.1 |
| 9,985,442 B2 | 5/2018 | Von Novak, III et al. | H02J 5/005 |
| 11,196,266 B2* | 12/2021 | Peralta | H02J 50/12 |
| 2004/0207503 A1* | 10/2004 | Flanders | H01F 29/146 336/223 |
| 2007/0109089 A1* | 5/2007 | Flanders | H01F 21/08 336/220 |
| 2015/0084427 A1* | 3/2015 | Moon | H02J 50/402 307/104 |
| 2016/0013667 A1 | 1/2016 | Hosotani et al. | H02J 50/40 307/104 |
| 2017/0236638 A1* | 8/2017 | Mayo | H01F 38/14 307/104 |
| 2019/0229773 A1* | 7/2019 | Mao | H04B 5/266 |
| 2021/0075109 A1* | 3/2021 | Peralta | H01Q 5/335 |
| 2021/0328628 A1* | 10/2021 | Baek | H01Q 7/00 |

FOREIGN PATENT DOCUMENTS

| | | |
|---|---|---|
| RU | 2408476 C2 | 1/2011 |
| RU | 2013115045 A | 10/2014 |
| SU | 1748208 A1 | 7/1992 |

\* cited by examiner

TRANSMITTER CIRCUIT OF A WIRELESS POWER TRANSFER SYSTEM

WAVEFORM DIAGRAM

DETAILED DIAGRAM OF THE TRANSMITTER CIRCUIT

ANOTHER EMBODIMENT OF THE
TRANSMITTER CIRCUIT

ANOTHER EMBODIMENT OF A
TRANSMITTER CIRCUIT

ANOTHER EMBODIMENT OF THE TRANSMITTER CIRCUIT

ANOTHER EMBODIMENT OF A
TRANSMITTER CIRCUIT

WIRELESS POWER TRANSFER SYSTEMS

WIRELESS POWER TRANSFER SYSTEM WITH FERRITE PLATE

METHOD OF CONFIGURING A WIRELESS POWER TRANSFER SYSTEM

EMBODIMENT OF TRANSMITTER CONDUCTOR HAVING LITZ WIRE AND MULTILAYER CERAMIC CAPACITORS

EMBODIMENT OF TRANSMITTER CONDUCTOR HAVING METAL PLATES

EMBODIMENT OF TRANSMITTER CONDUCTOR HAVING METAL TUBES

РECEIVER CIRCUIT OF A WIRELESS POWER TRANSFER SYSTEM

ANOTHER EMBODIMENT OF THE RECEIVER CIRCUIT

ANOTHER EMBODIMENT OF THE RECEIVER CIRCUIT

ANOTHER EMBODIMENT OF THE RECEIVER CIRCUIT

ANOTHER EMBODIMENT OF THE RECEIVER CIRCUIT

WIRELESS POWER TRANSFER SYSTEM WITH OPEN LOOP REACTANCE MATCHING CIRCUITRY

CROSS REFERENCE TO RELATED APPLICATIONS

This application is a continuation of, and claims the benefit under 35 U.S.C. § 120 from, nonprovisional U.S. patent application Ser. No. 16/948,868, entitled "Wireless Power Transfer System With Open Loop Reactance Matching Circuitry," filed on Oct. 3, 2020. U.S. patent application Ser. No. 16/948,868 claims the benefit under 35 U.S.C. § 119 from U.S. Provisional Patent Application Ser. No. 62/909,854, entitled "Open Loop Reactance Matching (OLRM) and Application for Wireless Power Transfer," filed on Oct. 3, 2019. The entire subject matter of the foregoing documents is expressly incorporated herein by reference.

TECHNICAL FIELD

The present invention relates generally to power electronics, and more specifically to wireless power transfer circuitry.

BACKGROUND INFORMATION

Wireless power transfer systems provide transmission of electrical energy without wired links. In a typical wireless power transfer system, a transmitter receives electrical energy from a power source and generates a magnetic field. The magnetic field wirelessly transmits power to a receiver device across space. The receiver device receives the wireless power transmission and supplies an electrical load. Wireless power transmission eliminates wired connections and is more convenient for most users as compared to power transfer via a physical link.

SUMMARY

A wireless power transfer system includes a power source, a transmitter circuit, a conductor, and a receiver circuit. The transmitter circuit is supplied by the power source and wirelessly supplies the receiver circuit via the conductor. The conductor includes a plurality of distributed capacitances coupled in series with the conductor. The receiver circuit includes a primary coil and a secondary coil. The primary coil has at least two turns and includes a plurality of distributed series capacitances. The transmitter circuit includes an Open Loop Reactance Matching (OLRM) control circuit, a first inverter, a second inverter, and a third inverter. In operation, the OLRM control circuit controls the first inverter to generate a high frequency AC voltage. The high frequency AC voltage is supplied to the conductor. During wireless power transfer, the OLRM control circuit performs reactance matching by controlling the second and third inverters to maintain the transmitter voltage and current in phase without requiring any feedback sensing.

In various applications, including wireless power transfer applications, RF systems, power transmission lines, electric loads, and electric machines, a reactance of an inductive or capacitive circuit needs to be fully compensated or matched by an opposite reactance value. Reactance matching circuits with all passive elements are typically not precise, and, especially in the case of high reactance values, even the slightest error in the matching circuit will result in a high driving voltage which for some cases may not be practical.

For wireless power transfer applications, the matching circuits need to adaptively adjust themselves to follow the changes in the load. Use of fast switching semiconductor switches, such as silicon carbide (SiC), gallium nitride (GaN), IGBTs, or MOSFETs, the active reactance matching circuits can be realized. In high frequency and low current applications, designing a robust close loop controller is nontrivial and performance of the controller is affected by the accuracy of the sensors and digital controller. The various embodiments described below provide open loop, sensorless, reactance matching that is self-tuning and precise for different loading conditions.

In one embodiment, power is transferred wirelessly via a transformer effect or magnetic coupling between two coupled coils. In this embodiment, lack of an iron core and a large gap between the primary and secondary coils will cause loose coupling with low magnetizing inductance between transmitter and receiver coils. To improve the coupling between the transmitter and receiver coils, an operational frequency needs to be significantly increased. Increasing the operational frequency has adverse effects, such as increasing the leakage reactance of the transmitter and receiver coils, and increasing the resistive losses due to the skin effect. To compensate for leakage reactance of the transmitter and receiver coils, several novel techniques are employed. First, series capacitors are provided in a distributed manner to compensate a major portion of the transmitter coil reactance. By distributing the capacitors, an improved voltage profile and lower capacitor losses are achieved. Second, precise reactance matching is provided by an Open Loop Reactance Matching (OLRM) control circuit. A voltage source converter with a capacitive DC-link is used in series with the source and switched with a 90-degrees lead or lag phase shift in relation to the source voltage signal. Third, switched capacitors are used in series with the voltage source converter to alleviate the amount of required semiconductor switches, and to reduce stress on the voltage source converter. The switched capacitors switch OFF and ON with respect to the DC link voltage value.

To reduce resistive losses due to the skin effect, a transmitter source is operated as a current source with constant magnitude, regardless of load condition. The current is low enough to reduce transmitter losses while still providing enough magnetic flux for wireless power transfer. In the absence of a receiver, the voltage across the current source is low, and is equal to the resistance of the transmitter conductor multiplied by the transmitter current. This results from the perfect reactance matching provided by the novel OLRM control circuit that compensates for all the reactance of the transmitter circuit. When a receiver circuit with resistive load couples with a portion of the transmitter circuit, the reactance of that portion is replaced by the resistance of the load and does not become compensated by the reactance matching scheme. As such, the voltage across the current source increases to keep the current magnitude through the transmitter circuit constant. This is effectively equivalent to transferring power from the source to the receiver circuit load since power is equal to voltage multiplied by current. In this case, power transfers through voltage rather than through current. Losses of the transmitter will remain nearly constant and similar to a zero load condition because the transmitter current is maintained constant. In some embodiments, a DC-to-DC buck-boost power converter circuit or transformer is used between the load and receiver circuit for adjusting equivalent resistance under different loading conditions. In addition, a Litz wire, aluminum, or copper foil is used to reduce the skin effect losses.

In one embodiment, a wireless power transfer system has one or more transmitter circuits coupled to a conductor. A system operational frequency is fixed and does not need any adjustment under varying loading conditions. Any number of receiver circuits may receive power simultaneously from the one or more transmitter circuits. In this embodiment, transmitter and receiver coils do not need to be planar spiral inductors, and, depending on a magnitude of the system operational frequency, only one turn can be used at the transmitter circuit. Distributed series capacitors are used to compensate a major portion of a transmitter inductance. The distributed series capacitors provide a better voltage profile across the conductor, which is important for insulator design and reduces capacitor losses that would otherwise result at high voltages.

To reduce undesirable skin effect, eddy current, proximity effect, and capacitor losses, the transmitter circuit is designed with at least one of several novel features. In one example, a conductor is provided having a Litz wire and multilayer ceramic capacitors coupled in series. The multilayer ceramic capacitors are distributed throughout the conductor and compensate the conductor. In another example, a conductor is provided having a plurality of sections of copper or aluminum foil. Each section is isolated from the other by a dielectric material. The common area between each section creates the required distributed capacitors for compensating the conductor. In still another example, a conductor is provided having a plurality of sections of copper or aluminum tubes. Each section is isolated from the other by a dielectric material. The common area between each section creates the required distributed capacitors for compensating the conductor.

Reactance matching is obtained by a voltage source converter with a capacitive DC link. The voltage source converter is controlled to switch with 90-degrees lead or lag in relation to the source voltage signal. Either a half-bridge or full-bridge inverter is used as the voltage source converter. A phase-shifted full-bridge DC-to-AC inverter is used to reduce the switching losses due to Zero Voltage Switching (ZVS). Fast switches such as Silicon Carbide (SiC) or Gallium Nitride (GaN) are used to reduce switching losses. Switched capacitors are used in series with the voltage source converter to alleviate the amount of required semiconductor switches and to reduce stress on the voltage source converter. The switched capacitors switch OFF or ON with respect to the DC-link voltage level. If the DC-link voltage level is too high, then switched capacitors will go online to reduce the DC-link voltage. If, on the other hand, the DC-link voltage level is too low, then the switched capacitors will go offline to maintain precise reactance matching.

A transmitter source is a current source with a constant magnitude regardless of loading condition. The current is maintained to be low enough to reduce transmitter losses but high enough to provide sufficient magnetic flux for wireless power transfer. In the absence of a receiver circuit, the voltage across the current source is low and equal to the resistance of the transmitter conductor multiplied by the transmitter current. Reactance matching provided by the novel OLRM control circuit compensates all the reactance of the transmitter. When a receiver circuit with a resistive load couples with a portion of the transmitter circuit, then a reactance of that portion is replaced by the resistance of the load and is not compensated by the reactance matching functionality. As a result, the voltage across the current source will increase to keep the current magnitude through the transmitter constant. This result is equivalent to transferring power from the source to the receiver load since power is equal to voltage multiplied by current. In this situation, power transfers through the voltage rather than the current. Losses of the transmitter circuit will remain nearly constant and similar to the zero load condition since the transmitter current is controlled to be constant. In one embodiment, a DC-to-DC buck-boost power converter circuit or transformer is configured between the load and receiver for adjusting equivalent resistance under different loading conditions.

The constant current source of the transmitter circuit is provided via one of several techniques. In one embodiment, a current controlled DC-DC converter is connected to a phase-shifted full-bridge DC-to-AC inverter, with a constant phase shift between the bridges. In another embodiment, a phase-shifted full-bridge DC-to-AC inverter is provided. The switching phase shift between the bridges is regulated to maintain current through the transmitter circuit constant. In another embodiment, a half-bridge DC-to-AC inverter is provided. The duty cycle of a high frequency PWM switching is regulated to maintain current through the transmitter circuit constant.

The novel wireless power transfer systems are bidirectional and power is transferable from the receiver circuits to the transmitter circuits. The wireless power transfer systems have minimal impact on foreign conductive objects due to the low resistance path of these objects. The wireless power transfer systems are usable to wirelessly transfer power to home appliances and all electronic devices. In addition, the wireless power transfer systems are usable to wirelessly transfer power to all moving vehicles operated in everyday life, including vehicles, buses, high occupancy passenger vehicles, shuttles, commercial vehicles, and delivery vehicles operating on roads. In one embodiment, various wireless power transfer systems are provided but are not synchronized. In this case, traveling vehicles momentarily lose energy while moving from one loop (transmitter conductor) of a wireless power transfer system to another loop of a different wireless power transfer system. In another embodiment, one loop extends across a roadway and is synchronized with various transmitter circuits. In this example, the current sources at the various locations of the loops are synchronized. The synchronization is done in one example via GPS signals or via current through a power line. This embodiment provides more reliability and vehicles will not lose energy while within the loop. To control the current sources, a decentralized control scheme such as a droop controller is utilized.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
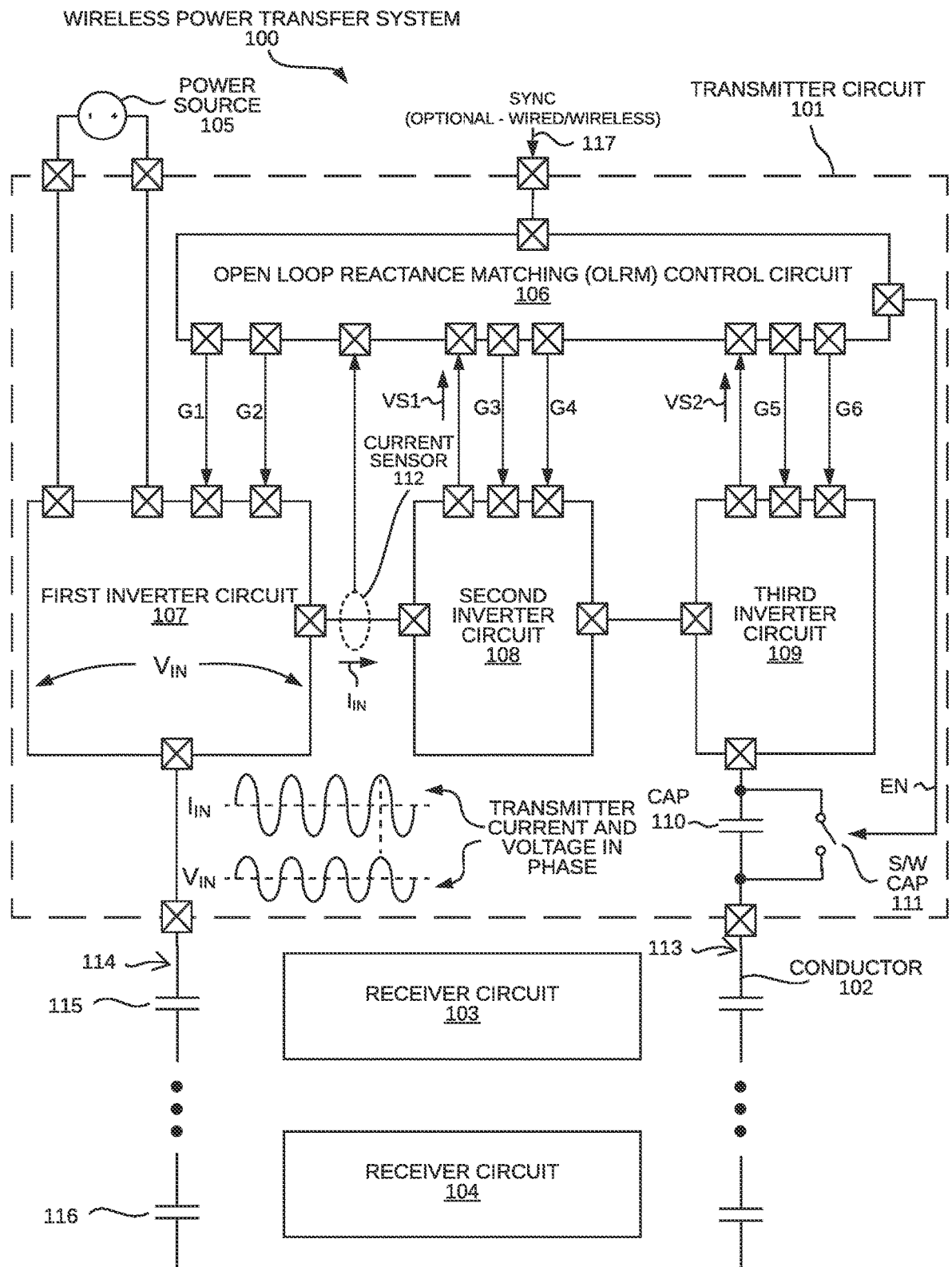
FIG. 1 is a diagram of a wireless power transfer system 100.

Reference will now be made in detail to some embodiments of the invention, examples of which are illustrated in the accompanying drawings. FIG. 1 is a diagram of a wireless power transfer system 100. The wireless power transfer system 100 comprises a transmitter circuit 101, a conductor 102, and receiver circuits 103 and 104, and a power source 105. In this example, the power source 105 is a Direct Current (DC) source that supplies a DC voltage to the transmitter circuit 101. In other embodiments, the power source 105 is an Alternating Current (AC) source that supplies an AC voltage to the transmitter circuit 101. The transmitter circuit 101 supplies the receiver circuits 103 and 104 wirelessly via the conductor 102.

The transmitter circuit 101 comprises an Open Loop Reactance Matching (OLRM) control circuit 106, a first inverter circuit 107, a second inverter circuit 108, a third inverter circuit 109, a capacitor 110, a switch 111, and a current sense circuit 112. The first inverter circuit 107 is realized as a half-bridge DC-to-AC power converter or as a full-bridge DC-to-AC power converter. The second inverter circuit 108 and the third inverter circuit 109 include a DC-link capacitor and are selectively realized as either half-bridge power converters or as full-bridge power converters. It is understood that each of the first inverter circuit 107, the second inverter circuit 108, the third inverter circuit 109 may be realized in accordance with any combination of power electronics topologies.

The OLRM control circuit 106 controls operation of the first inverter circuit 107, the second inverter circuit 108, and the third inverter circuit 109. The OLRM control circuit 106 is configured to supply gate control signals G1 and G2 to the first inverter circuit 107. The control signals G1 and G2 controls switching of transistors within the first inverter circuit 107. The OLRM control circuit 106 is configured to supply gate control signals G3 and G4 to the second inverter circuit 108. The control signals G3 and G4 control switching of transistors within the second inverter circuit 108. The OLRM control circuit 106 is configured to supply gate control signals G5 and G6 to the third inverter circuit 109. The control signals G5 and G6 control switching of transistors within the third inverter circuit 109. The current sense circuit 112 is configured to detect a transmitter current $I_{IN}$ and to supply the detected transmitter current $I_{IN}$ to the OLRM control circuit 106.

Each of the second inverter circuit 108 and the third inverter circuit 109 includes a DC-link capacitor and a voltage sensor. The voltage sensor senses a voltage across the DC-link capacitor. The second inverter circuit 108 detects a voltage sense signal VS1 indicative of the DC-link voltage and supplies the voltage sense signal VS1 to the OLRM control circuit 106. The third inverter circuit 109 detects a voltage sense signal VS2 indicative of the DC-link voltage and supplies the voltage sense signal VS2 to the OLRM control circuit 106.

The conductor 102 is coupled to the transmitter circuit 101 and wirelessly transfers power to the receiver circuits 103 and 104. A first end 113 of the conductor 102 is coupled to an output terminal of the transmitter circuit 101. A second end 114 of the conductor 102 is coupled to an output terminal of the transmitter circuit 101. The conductor 102 includes a plurality of distributed capacitances coupled in series. Reference numerals 115 and 116 identify two such capacitances in series. The number of distributed capacitances is design dependent. Typically the greater the distance conductor 102 extends, the more distributed capacitances that will be coupled in series along conductor 102.

The conductor 102 is optionally coupled to other transmitter circuits having a similar structure as transmitter circuit 101. To ensure effective power transfer, each transmitter circuit must be synchronized. Reference numeral 117 identifies a synchronization signal received onto the OLRM control circuit 106. The synchronization signal is received via a wired connection or via a wireless connection.

The length of conductor 102 can extend a few inches or several miles depending on the application. For example, in a consumer device application, the conductor 102 may extend a sufficient distance to support wireless charging of a few devices, such as mobile phones, tablets, and laptops. In such applications, there might be a single transmitter circuit 101. In large-scale applications, the conductor 102 might extend thousands of miles and be connected to many other transmitter circuits. In one example, the conductor extends along a transportation infrastructure, such as roadways, and is used to wireless charge vehicles or autonomous drones.

In operation, the OLRM control circuit 106 controls the first inverter circuit 107 as a power source converter and controls the second inverter circuit 108 and the third inverter circuit 109 as reactance matching compensators. The first inverter circuit 107 receives a DC voltage and generates a high frequency AC voltage. The high frequency AC voltage has a frequency that is greater than thirty kilohertz (30 kHz). The high frequency AC voltage is supplied to the second inverter circuit 108 and to the third inverter circuit 109.

In accordance with at least one novel aspect, the transmitter current $I_{IN}$ and the transmitter voltage $V_{IN}$ remain in phase during operation of the transmitter circuit 101. The OLRM control circuit 106 achieves reactance matching by controlling gating control signals G3 and G4 to be ninety-degree lead phase shifted with respect to gating control signals G1 and G2 and by controlling gating control signals G5 and G6 to be ninety-degree lag phase shifted with respect to gating control signals G1 and G2. The OLRM control circuit 106 is said to provide "open loop" reactance matching functionality because reactance matching is achieved without detecting any feedback signals. The transmitter current $I_{IN}$ is not necessary and provided primarily for more robust power control.

The capacitance 110 is provided in system 100 to achieve desired load balancing. If the load is excessively inductive, then the capacitance 110 is enabled, whereas if the load is excessively capacitive, then the capacitance 110 is disabled. The OLRM control circuit 106 selectively enables and disables capacitance 110 by supplying a control signal EN to the switch 111. If the OLRM control circuit 106 detects too much inductive load, then the OLRM control circuit 106 enables capacitance 110 by controlling the switch 111 in a non-conductive state. If, on the other hand, the OLRM control circuit 106 detects too much capacitive load, then the OLRM control circuit 106 disables capacitance 110 by controlling the switch 111 in a conductive state. In other embodiments, no capacitance 110 is provided. In alternative embodiments, the capacitance 110 is provided and controlled outside of the transmitter circuit 101.

In accordance with another novel aspect, the wireless power transfer system 100 supports wireless power transfer to any number of receiver circuits. Although two receiver circuits 103 and 104 are shown in FIG. 1, other embodiments include additional receiver circuits. Optimal power transfer occurs whenever the receiver circuits are disposed near the conductor 102.

Figure 2:
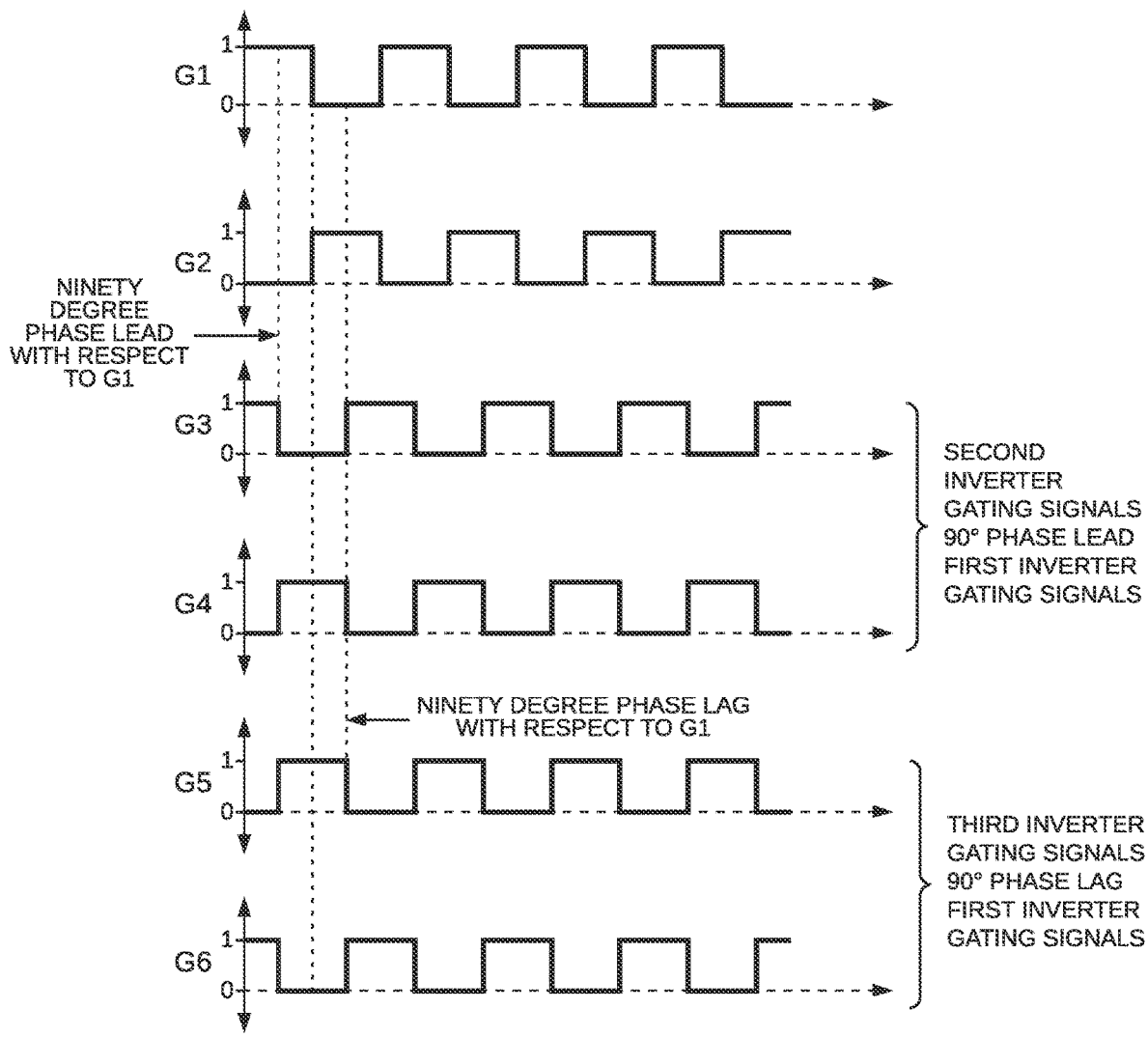
FIG. 2 is a waveform diagram showing gating signals generated by the OLRM control circuit in the embodiment of FIG. 1.

FIG. 2 is a waveform diagram showing gating signals generated by the OLRM control circuit in the embodiment of FIG. 1. In this example, each of the inverter circuits 107, 108, and 109 are realized as half-bridge power converters each having a high side transistor and a low side transistor. Gate control signal G1 is supplied to a high side transistor of the first inverter circuit 107 and gate control signal G2 is supplied to a low side transistor of the first inverter circuit 107. Gate control signal G3 is supplied to a high side transistor of the second inverter circuit 108 and gate control signal G4 is supplied to a low side transistor of the second inverter circuit 108. Gate control signal G5 is supplied to a high side transistor of the third inverter circuit 109 and gate control signal G6 is supplied to a low side transistor of the third inverter circuit 109.

The gate control signals G3, G4, G5, and G6 of the second and third inverter circuits 108 and 109 are ninety-degree phase shifted with respect to the gate control signals G1 and G2 of the first inverter circuit 107. Gate control signal G3 is ninety-degree (90°) lead phase shifted with respect to gate control signal G1 and gate control signal G4 is ninety-degree (90°) lead phase shifted with respect to gate control signal G2. Gate control signal G5 is ninety-degree (90°) lag phase shifted with respect to gate control signal G1 and gate control signal G6 is ninety-degree (90°) lag phase shifted with respect to gate control signal G2. Supplying ninety-degree (90°) lead phase shifted signals to the second inverter circuit 108 compensates for inductive-type load. Supplying ninety-degree (90°) lag phase shifted signals to the third inverter circuit 109 compensates for capacitive-type load.

Controlling the second and third inverter circuits 108 and 109 achieves reactance matching during power transfer regardless of whether the load is inductive or capacitive. No feedback sensing is required to generate the gating signals G3, G4, G5, and G6. The OLRM control circuit 106 phase shifts by ninety degrees the gating signals G1 and G2 supplied to the first inverter circuit 107 and reactance matching is performed in an open-loop, feedback-less fashion.

Figure 3:
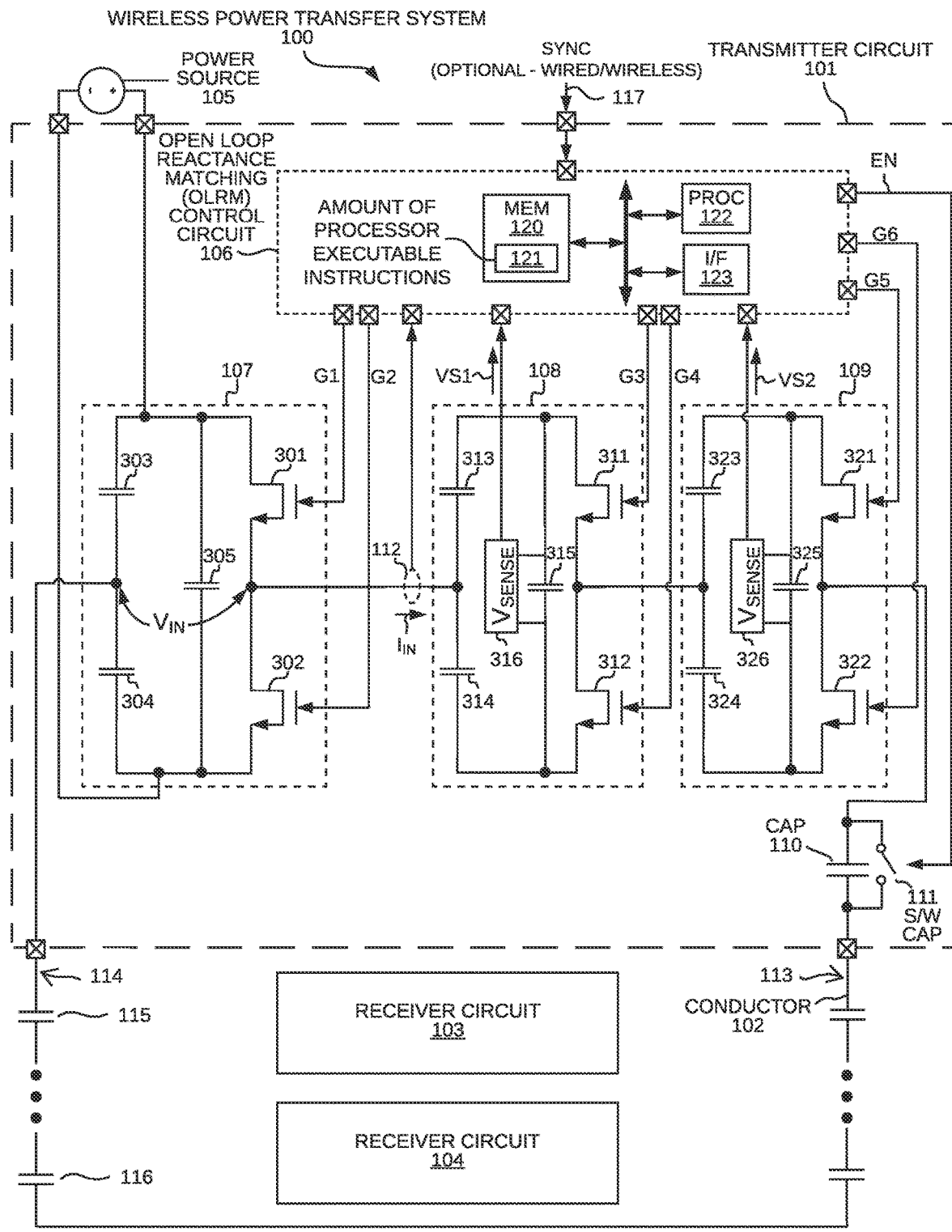
FIG. 3 is a detailed circuit diagram of the transmitter circuit 101.

FIG. 3 is a detailed circuit diagram of the transmitter circuit 101. In this example, the first inverter circuit 107, the second inverter circuit 108, and the third inverter circuit 109 are realized as half-bridge inverters. The first inverter circuit 107 comprises a first transistor 301, a second transistor 302, a first capacitor 303, a second capacitor 304, and a DC-link capacitor 305. The second inverter circuit 108 comprises a first transistor 311, a second transistor 312, a first capacitor 313, a second capacitor 314, a DC-link capacitor 315, and a voltage sense circuit 316. The third inverter circuit 109 comprises a first transistor 321, a second transistor 322, a first capacitor 323, a second capacitor 324, a DC-link capacitor 325, and a voltage sense circuit 326. The transistors 301, 302, 311, 312, 321, and 322 are realized as any suitable power switching transistor. In one example, each of the transistors 301, 302, 311, 312, 321, and 322 is a power transistor selected from the group consisting of: a Bipolar Junction Transistor (BJT), a Metal Oxide Semiconductor Field-Effect Transistor (MOSFET), an Insulated-Gate Bipolar Transistor (IGBT), a Gallium Nitride Field-Effect Transistor (GaN FET), and a Silicon Carbide Field-Effect Transistor (SiC FET). In one embodiment, each of the transistors also includes an anti-parallel diode. The anti-parallel diode is an intrinsic body diode or an external diode.

The OLRM control circuit 106 is realized using any suitable computing hardware. In various embodiments, the OLRM control circuit 106 is implemented using a microcontroller, a field-programmable gate array (FPGA), a Programmable Logic Array (PLA), an integrated circuit, discrete analog components, software instructions, or a combination of hardware and software. In this example, the OLRM control circuit 106 includes a memory 120 that stores an amount of machine readable instructions 121, a processor 122, and an interface 123 that interfaces with outside circuitry. In one example, processor 122 reads the amount of instructions 121 from memory 120 across a bus and executes the instructions causing transmitter 101 to operate as explained in detail below.

In operation, the OLRM control circuit 106 controls first inverter circuit 107 to operate as a voltage source in a current control mode. The OLRM control circuit 106 supplies gating signal G1 to transistor 301 and gating signal G2 to transistor 302. The gating signal G1 is one-hundred and eighty degrees (180°) phase shifted with respect to gating signal G2. The transistors 301 and 302 are controlled to output a high frequency AC voltage which provides magnetic coupling characteristics that enable wireless power transfer. In this example, the transistors 301 and 302 are controlled using a PWM (pulse width modulation) scheme to maintain the transmitter current $I_{IN}$ at a constant RMS (Root Mean Square) value.

The OLRM control circuit 106 controls the second inverter circuit 108 to operate as a compensator that performs reactance matching to compensate for inductive loading in the system 100. The OLRM control circuit 106 supplies gating signal G3 to transistor 311 and gating signal G4 to transistor 312. The OLRM control circuit 106 generates the gating signal G3 by generating a ninety-degree (90°)

lead phase shifted version of the PWM reference signal of the gating signal G1. The OLRM control circuit 106 generates the gating signal G4 by generating a ninety-degree (90°) lead phase shifted version of the PWM reference signal of the gating signal G2. Consequently, the transistors 311 and 312 switch with a ninety-degree (90°) lead phase shift with respect to a fundamental frequency of the transmitter voltage $V_{IN}$ across the first inverter 107. The OLRM control circuit 106 does not perform any feedback sensing to generate the gating signals G3 or G4. The gating signal G3 is one-hundred and eighty degrees (180°) phase shifted with respect to gating signal G4. In some embodiments, deadtime is introduced in switching transistors 311 and 312 to avoid shoot through complications.

The OLRM control circuit 106 controls the third inverter circuit 109 to operate as a compensator that performs reactance matching to compensate for capacitive loading in the system 100. The OLRM control circuit 106 supplies gating signal G5 to transistor 321 and gating signal G6 to transistor 322. The OLRM control circuit 106 generates the gating signal G5 by generating a ninety-degree (90°) lag phase shifted version of the PWM reference signal of the gating signal G1. The OLRM control circuit 106 generates the gating signal G6 by generating a ninety-degree (90°) lag phase shifted version of the PWM reference signal of the gating signal G2. Consequently, the transistors 321 and 322 switch with a ninety-degree (90°) lag phase shift with respect to a fundamental frequency of the transmitter voltage $V_{IN}$ across the first inverter 107. The OLRM control circuit 106 does not perform any feedback sensing to generate the gating signals G5 or G6. The gating signal G5 is one-hundred and eighty degrees (180°) phase shifted with respect to gating signal G6. In some embodiments, deadtime is introduced in switching transistors 321 and 322 to avoid shoot through complications.

The OLRM control circuit 106 selectively enables and disables capacitance 110 based on the DC-link voltages of the second and third inverter circuits 108 and 109. The OLRM control circuit 106 receives a voltage sense signal VS1 from the voltage sense circuit 316 of the second inverter circuit 108. The voltage sense signal VS1 indicates the DC-link voltage across the second inverter 108. The OLRM control circuit 106 receives a voltage sense signal VS2 from the voltage sense circuit 326 of the third inverter circuit 109. The voltage sense signal VS2 indicates the DC-link voltage across the third inverter 109. If the voltage VS1 exceeds a first threshold, then the OLRM control circuit 106 asserts the control signal EN causing the switch 111 to switch to a non-conductive state and enabling the capacitor 110. If the voltage VS2 exceeds a second threshold, then the OLRM control circuit 106 de-asserts the control signal EN causing the switch 111 to switch to a conductive state and disabling the capacitor 110. In other embodiments, the capacitor 110 and switch 111 are excluded altogether and not part of the system 100.

In other embodiments, the transmitter circuit 101 includes the OLRM control circuit 106, the first inverter circuit 107, and only one of the two inverter circuits 108 or 109. For example, if in another embodiment only inductive load compensation is desired, then only the second inverter circuit 108 is included and controlled to switch with a ninety-degree (90°) lead phase shift with respect to the transmitter voltage $V_{IN}$, and the third inverter circuit 109 is excluded from this other embodiment. If, on the other hand, in another embodiment only capacitive load compensation is desired, then only the third inverter circuit 109 is included and controlled to switch with a ninety-degree (90°) lag phase shift with respect to the transmitter voltage $V_{IN}$, and the second inverter circuit 108 is excluded from this other embodiment.

In embodiments where the transmitter circuit 101 is the only other transmitter circuit, then no synchronization circuit, such as a GPSDO (Global Positioning System Disciplined Oscillator), is included in the OLRM control circuit 101. If the transmitter circuit 101 is in a system with several other transmitter circuits coupled to the conductor 102, then all the transmitter circuits are synchronized via synchronization circuitry that receives a synchronization signal. In this example, the transmitting circuit 101 receives a synchronization signal SYNC 117. The synchronization signal SYNC 117 may be received via a wired or wireless connection depending on the distance between the transmitting circuitry and depending on the implementation.

Figure 4:
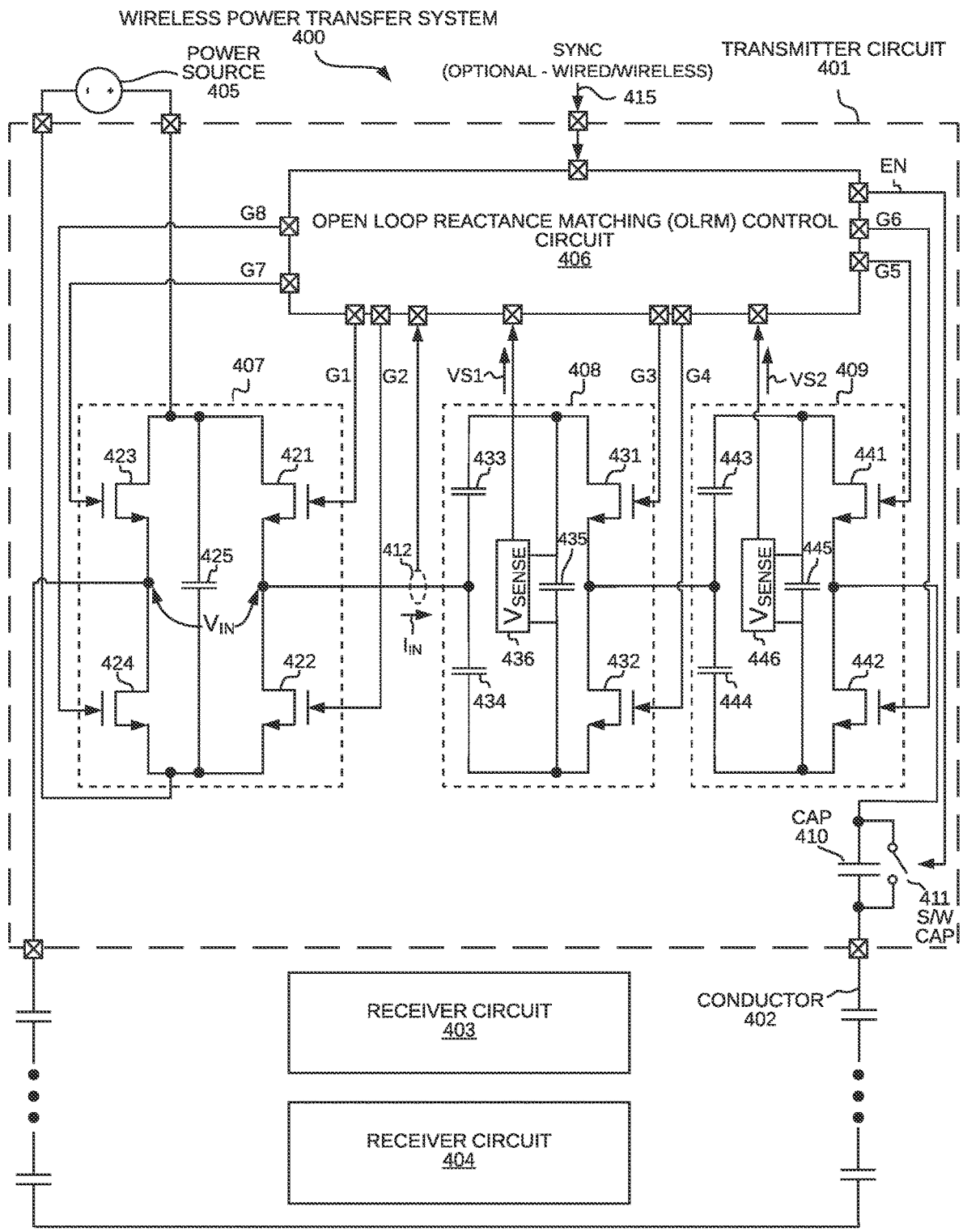
FIG. 4 is a diagram of a wireless power transfer system 400 in accordance with another embodiment.

FIG. 4 is a diagram of a wireless power transfer system 400 in accordance with another embodiment. The wireless power transfer system 400 provides similar reactance matching functionality as in the wireless power transfer system 100 of FIGS. 1 and 3, and with comparatively more robust power control. In the example shown in FIG. 4, the wireless power transfer system 400 comprises a transmitter circuit 401, a conductor 402, receiver circuits 403 and 404, and a power source 405. The power source 405 is a DC voltage source that supplies a DC voltage to the transmitter circuit 401. The transmitter circuit 401 comprises an Open Loop Reactance Matching (OLRM) control circuit 406, a first inverter circuit 407, a second inverter circuit 408, a third inverter circuit 409, a capacitor 410, a switch 411, and a current sense circuit 412.

In the example of FIG. 4, the first inverter circuit 407 is realized as a full-bridge inverter and the second and third inverter circuits 408 and 409 are realized as half-bridge inverters. In this example, the first inverter circuit 407 comprises a first transistor 421, a second transistor 422, a third transistor 423, a fourth transistor 424, and a DC-link capacitor 425. The second inverter circuit 408 comprises a first transistor 431, a second transistor 432, a first capacitor 433, a second capacitor 434, a DC-link capacitor 435, and a voltage sense circuit 436. The third inverter circuit 409 comprises a first transistor 441, a second transistor 442, a first capacitor 443, a second capacitor 444, a DC-link capacitor 445, and a voltage sense circuit 446.

The transistors 421, 422, 423, 424, 431, 432, 441, and 442 are realized as any suitable power switching transistor. In one example, each of the transistors 421, 422, 423, 424, 431, 432, 441, and 442 is a power transistor selected from the group consisting of: a Bipolar Junction Transistor (BJT), a Metal Oxide Semiconductor Field-Effect Transistor (MOSFET), an Insulated-Gate Bipolar Transistor (IGBT), a Gallium Nitride Field-Effect Transistor (GaN FET), and a Silicon Carbide Field-Effect Transistor (SiC FET). In one embodiment, each of the transistors also includes an anti-parallel diode. The anti-parallel diode is an intrinsic body diode or an external diode.

In operation, the OLRM control circuit 406 controls the first inverter circuit 407 to operate as a voltage source in a current control mode. The transmitter circuit 401 of FIG. 4 provides more robust voltage source input control due to realizing the first inverter circuit 407 as a full-bridge inverter. The OLRM control circuit 406 controls transistors 421, 422, 423, and 424 to receive a DC voltage from power source 405 and output a high frequency AC voltage which provides magnetic coupling characteristics that enable wireless power transfer. The transistors 421, 422, 423, and 424 are controlled using a PSFB (phase shifted full-bridge)

scheme to maintain the transmitter current $I_{IN}$ at a constant RMS (Root Mean Square) value.

The OLRM control circuit 406 achieves reactance matching by generating ninety-degree (90°) lead and lag phase shifted versions of the PSFB reference signal that is used to control transistors 421, 422, 423, and 424 of the first inverter circuit 407. The ninety-degree (90°) lead version signals are supplied to and control transistors of the second inverter circuit 408. The ninety-degree (90°) lag version signals are supplied to and control transistors of the third inverter circuit 409. By controlling the second and third inverter circuits 408 and 409 in this way, reactance matching is achieved. The current sense circuit 412, capacitor 410, switch 411, voltage sense circuits 436 and 446, and synchronization signal SYNC 415 provide similar optional functionality as in the system 100 shown in FIG. 3.

In one example, OLRM control circuit 406 generates gate control signal G3 to be 90° degrees lead phase shifted with respect to voltage across the first inverter 407, and generates gate control signal G5 to be 900 degrees lag phase shifted with respect to voltage across the first inverter 407. OLRM control circuit 406 generates gate control signal G4 to be 180 degrees phase shifted with respect to gate control G3, and generates gate signal G6 to be 180 degrees phase shifted with respect to gate control G5.

Figure 5:
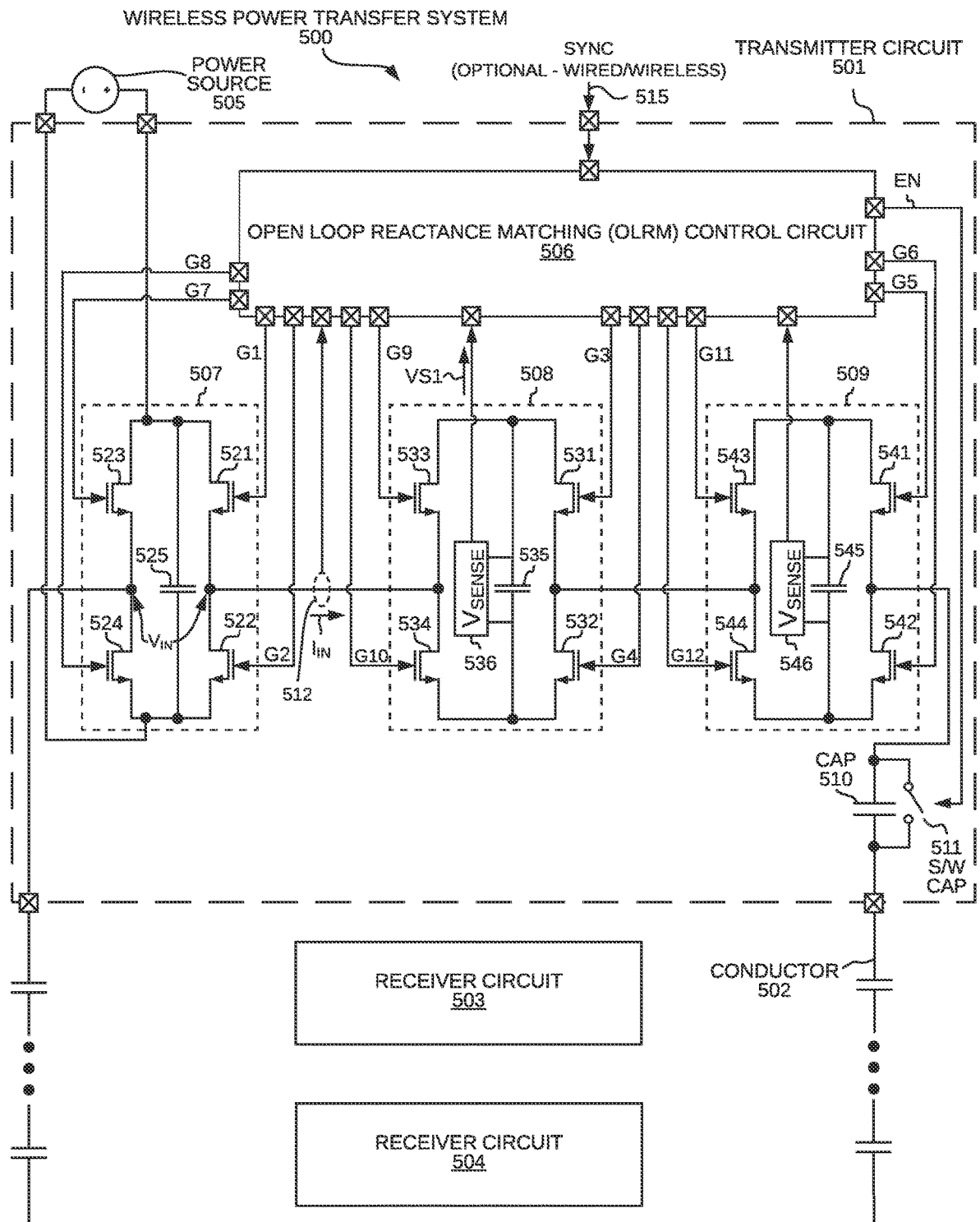
FIG. 5 is a diagram of a wireless power transfer system 500 in accordance with another embodiment.

FIG. 5 is a diagram of a wireless power transfer system 500 in accordance with another embodiment. The wireless power transfer system 500 provides similar reactance matching functionality as in the wireless power transfer system 100 of FIGS. 1 and 3, and with comparatively more robust power control. In the example shown in FIG. 5, the wireless power transfer system 500 comprises a transmitter circuit 501, a conductor 502, receiver circuits 503 and 504, and a power source 505. In this example, the power source 505 is a DC source that supplies a DC voltage to the transmitter circuit 501. The transmitter circuit 501 comprises an Open Loop Reactance Matching (OLRM) control circuit 506, a first inverter circuit 507, a second inverter circuit 508, a third inverter circuit 509, a capacitor 510, a switch 511, and a current sense circuit 512.

In the example of FIG. 5, the first inverter circuit 507, the second inverter circuit 508, and the third inverter circuit 509 are realized as full-bridge inverters. In this example, the first inverter circuit 507 comprises a first transistor 521, a second transistor 522, a third transistor 523, a fourth transistor 524, and a DC-link capacitor 525. The second inverter circuit 508 comprises a first transistor 531, a second transistor 532, a third transistor 533, a fourth transistor 534, a DC-link capacitor 535, and a voltage sense circuit 536. The third inverter circuit 509 comprises a first transistor 541, a second transistor 542, a third transistor 543, a fourth transistor 544, a DC-link capacitor 545, and a voltage sense circuit 546.

The transistors 521-524, 531-534, and 541-544 are realized as any suitable power switching transistor. In one example, each of the transistors 521-524, 531-534, and 541-544 is a power transistor selected from the group consisting of a Bipolar Junction Transistor (BJT), a Metal Oxide Semiconductor Field-Effect Transistor (MOSFET), an Insulated-Gate Bipolar Transistor (IGBT), a Gallium Nitride Field-Effect Transistor (GaN FET), and a Silicon Carbide Field-Effect Transistor (SiC FET). In one embodiment, each of the transistors also includes an anti-parallel diode. The anti-parallel diode is an intrinsic body diode or an external diode.

In operation, the OLRM control circuit 506 controls the first inverter circuit 507 to operate as a voltage source in a current control mode. The transmitter circuit 501 of FIG. 5 provides more robust voltage source input control due to realizing the first inverter circuit 507 as a full-bridge inverter. The OLRM control circuit 506 controls transistors 521, 522, 523, and 524 to receive a DC voltage from power source 505 and output a high frequency AC voltage which provides magnetic coupling characteristics that enable wireless power transfer. The transistors 521, 522, 523, and 524 are controlled using a PSFB (phase shifted full-bridge) scheme to maintain the transmitter current $I_{IN}$ at a constant RMS (Root Mean Square) value.

The OLRM control circuit 506 supplies gating signal G3 to transistor 531, gating signal G4 to transistor 532, gating signal G5 to transistor 541, gating signal G6 to transistor 542, gating signal G9 to transistor 533, gating signal G10 to transistor 534, gating signal G11 to transistor 543, gating signal G12 to transistor 544.

The OLRM control circuit 506 achieves reactance matching by generating ninety-degree (90°) lead and lag phase shifted versions of PSFB reference signal that is used to control transistors 521, 522, 523, and 524 of the first inverter circuit 507. The ninety-degree (90°) lead version signals are supplied to analogous control transistors of the second inverter circuit 508. The ninety-degree (90°) lag version signals are supplied to and control transistors of the third inverter circuit 509. By controlling the second and third inverter circuits 508 and 509 in this way, reactance matching is achieved. The current sense circuit 512, capacitor 510, switch 511, voltage sense circuits 536 and 546, and synchronization signal SYNC 515 provide similar optional functionality as in the system 100 shown in FIG. 3.

In one example, OLRM control circuit 506 generates gate control signal G3 to be 90 degrees lead phase shifted with respect to the voltage across the first inverter, and generates gate control signal G5 to be 90 degrees lag phase shifted with respect to the voltage across the first inverter. OLRM control circuit 506 generates gate control signal G4 to be 180 degrees phase shifted with respect to G3, and generates gate signal G6 to be 180 degrees phase shifted with respect to G5, and generates gate control signals G10 to be similar to G3, and G9 similar to G4, and G11 similar to G6, and G12 similar to G5.

Figure 6:
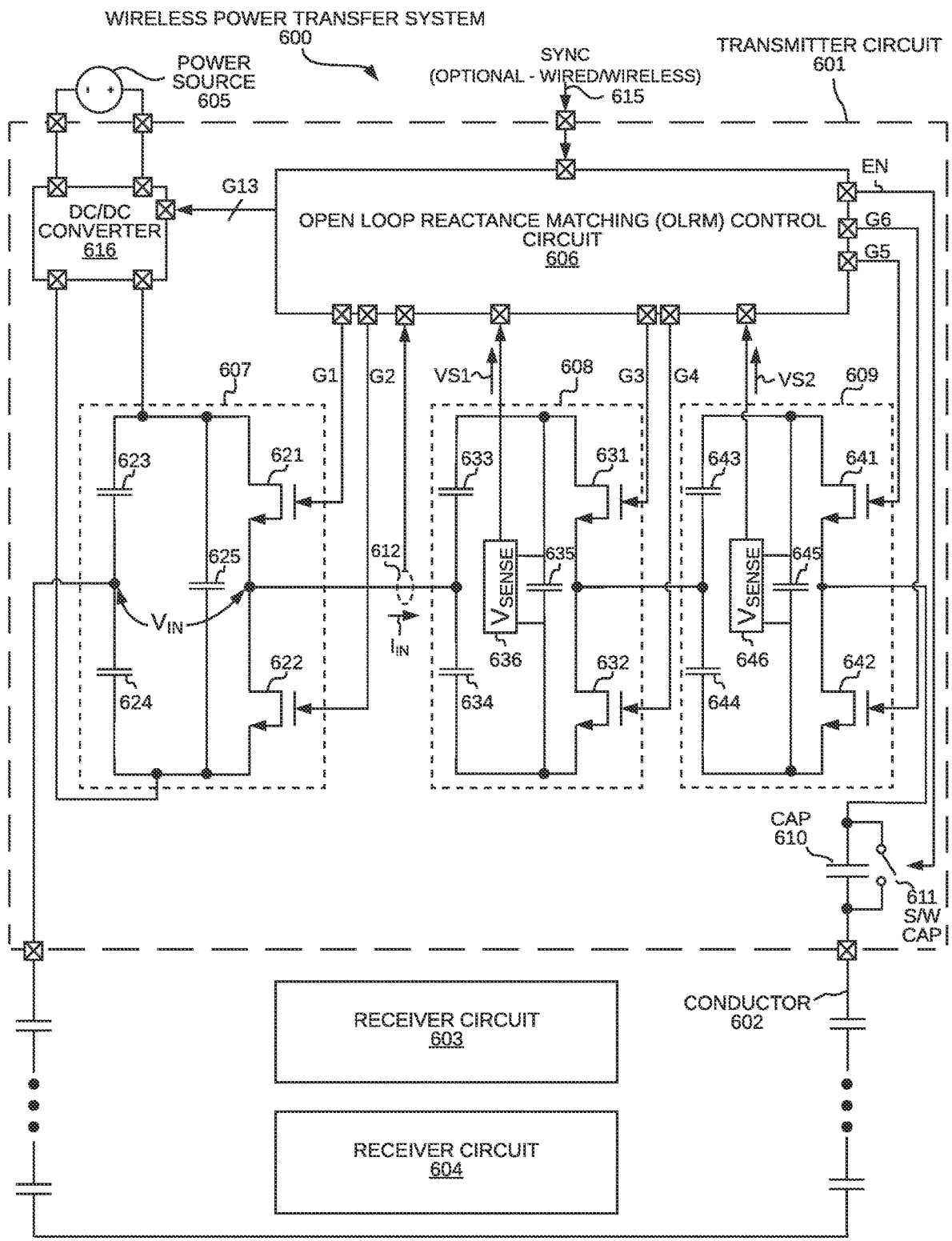
FIG. 6 is a diagram of a wireless power transfer system 600 in accordance with another embodiment.

FIG. 6 is a diagram of a wireless power transfer system 600 in accordance with another embodiment. The wireless power transfer system 600 provides similar reactance matching functionality as in the wireless power transfer system 100 of FIGS. 1 and 3, and includes more robust power control. A DC/DC power converter circuit 616 is included in a transmitter circuit 601 that provides voltage and current control at the input stage of a first power converter 607. The wireless power transfer system 600 comprises the transmitter circuit 601, a conductor 602, receiver circuits 603 and 604, and a power source 605. In this example, the power source 605 is a DC voltage source that supplies a DC voltage to the transmitter circuit 601. The transmitter circuit 601 comprises an Open Loop Reactance Matching (OLRM) control circuit 606, a first inverter circuit 607, a second inverter circuit 608, a third inverter circuit 609, a capacitor 610, a switch 611, a current sense circuit 612, and the DC-to-DC power converter circuit 616.

In the example of FIG. 6, the first inverter circuit 607, the second inverter circuit 608, and the third inverter circuit 609 are realized as half-bridge inverters. The first inverter circuit 607 comprises a first transistor 621, a second transistor 622, a first capacitor 623, a second capacitor 624, and a DC-link capacitor 625. The second inverter circuit 608 comprises a first transistor 631, a second transistor 632, a first capacitor 633, a second capacitor 634, a DC-link capacitor 635, and a voltage sense circuit 636. The third inverter circuit 109 comprises a first transistor 641, a second transistor 642, a first capacitor 643, a second capacitor 644, a DC-link capacitor 645, and a voltage sense circuit 646.

The transistors 621, 622, 631, 632, 641, and 642 are realized as any suitable power switching transistor. In one example, each of the transistors 621, 622, 631, 632, 641, and 642 is a power transistor selected from the group consisting of: a Bipolar Junction Transistor (BJT), a Metal Oxide Semiconductor Field-Effect Transistor (MOSFET), an Insulated-Gate Bipolar Transistor (IGBT), a Gallium Nitride Field-Effect Transistor (GaN FET), and a Silicon Carbide Field-Effect Transistor (SiC FET). In one embodiment, each of the transistors also includes an anti-parallel diode. The anti-parallel diode is an intrinsic body diode or an external diode.

In operation, the OLRM control circuit 606 controls the first inverter circuit 607 to operate as a voltage source. The OLRM control circuit 606 supplies gating signal G1 to transistor 621, gating signal G2 to transistor 622, gating signal G3 to transistor 631, gating signal G4 to transistor 632, gating signal G5 to transistor 641, gating signal G6 to transistor 642, and a multi-bit digital control signal G13 to the DC-to-DC power converter circuit 616. The OLRM control circuit 606 controls transistors 621 and 622 to receive a DC voltage from DC-to-DC power converter circuit 616 and output a high frequency AC voltage which provides magnetic coupling characteristics that enable wireless power transfer. The DC-to-DC power converter circuit 616 is controlled to maintain the transmitter current $I_{IN}$ at a constant RMS (Root Mean Square) value.

The DC-to-DC power converter circuit 616 provides the transmitter circuit 601 of FIG. 6 with more robust power control because the voltage and input at the input stage of the first inverter circuit 607 is controlled by appropriate commands to the DC-to-DC power converter circuit 616. The OLRM control circuit 606 configures the transmitter current $I_{IN}$ by supplying a command via the multi-bit digital control signal G13 to the DC-to-DC power converter circuit 616. In one embodiment, if the OLRM control circuit 606 detects the transmitter current $I_{IN}$ is above a threshold, then the OLRM control circuit 606 controls the DC-to-DC power converter circuit 616 to decrease the output voltage. If, on the other hand, the OLRM control circuit 606 detects the transmitter current $I_{IN}$ is below a threshold, then the OLRM control circuit 606 controls the DC-to-DC power converter circuit 616 to increase the output voltage.

The OLRM control circuit 606 achieves reactance matching by generating ninety-degree (90°) lead and lag phase shifted versions of the control signals that control transistors 621 and 622 of the first inverter circuit 607. The ninety-degree (90°) lead version signals are supplied to and control transistors of the second inverter circuit 608. The ninety-degree (90°) lag version signals are supplied to and control transistors of the third inverter circuit 609. By controlling the second and third inverter circuits 608 and 609 in this way, reactance matching is achieved. The current sense circuit 612, capacitor 610, switch 611, voltage sense circuits 636 and 646, and synchronization signal SYNC 615 provide similar optional functionality as in the system 100 shown in FIG. 3.

In one example, OLRM control circuit 606 generates gate control signals G3 and G4 to be 900 degrees lead phase shifted with respect to gate control signals G1 and G2, and generates gate control signal G5 and G6 to be 90° degrees lag phase shifted with respect to gate controls signals G1 and G2.

Figure 7:
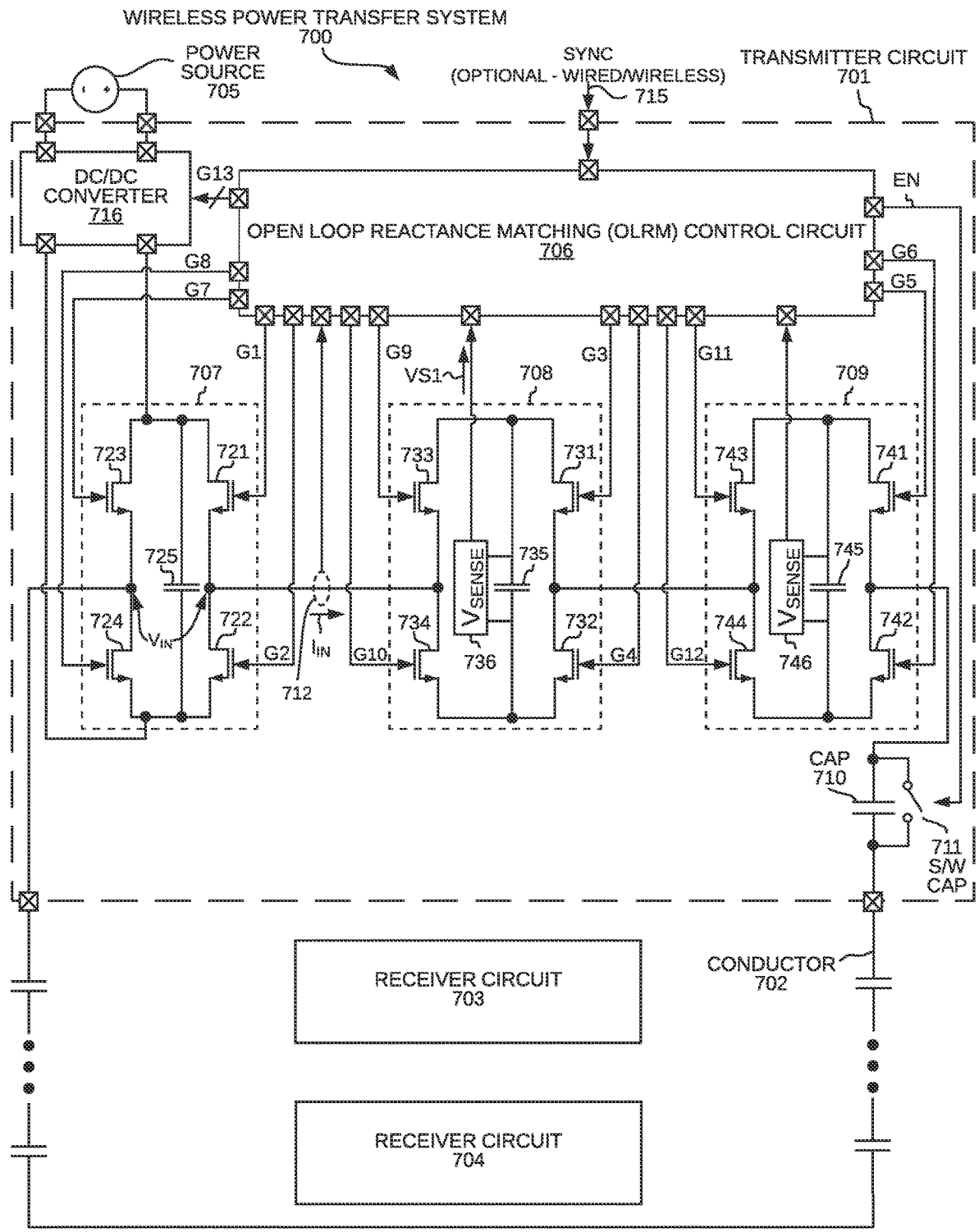
FIG. 7 is a diagram of a wireless power transfer system 700 in accordance with another embodiment.

FIG. 7 is a diagram of a wireless power transfer system 700 in accordance with another embodiment. The wireless power transfer system 700 provides similar reactance matching functionality as in the wireless power transfer system 100 of FIGS. 1 and 3, and includes more robust power control. A DC/DC power converter circuit 716 is included in a transmitter circuit 701 that provides voltage and current control at the input stage of a first power converter 707. The wireless power transfer system 700 comprises the transmitter circuit 701, a conductor 702, receiver circuits 703 and 704, and a power source 705. In this example, the power source 705 is a DC voltage source that supplies a DC voltage to the transmitter circuit 701. The transmitter circuit 701 comprises an Open Loop Reactance Matching (OLRM) control circuit 706, a first inverter circuit 707, a second inverter circuit 708, a third inverter circuit 709, a capacitor 710, a switch 711, and a current sense circuit 712.

FIG. 7 shows an example of the transmitter circuit 701 including the first inverter circuit 707, the second inverter circuit 708, and the third inverter circuit 709 realized as full-bridge inverters. In this example, the first inverter circuit 707 comprises a first transistor 721, a second transistor 722, a third transistor 723, a fourth transistor 724, and a DC-link capacitor 725. The second inverter circuit 708 comprises a first transistor 731, a second transistor 732, a third transistor 733, a fourth transistor 734, a DC-link capacitor 735, and a voltage sense circuit 736. The third inverter circuit 709 comprises a first transistor 741, a second transistor 742, a third transistor 743, a fourth transistor 744, a DC-link capacitor 745, and a voltage sense circuit 746.

The transistors 721-724, 731-734, and 741-744 are realized as any suitable power switching transistor. In one example, each of the transistors 721-724, 731-734, and 741-744 is a power transistor selected from the group consisting of: a Bipolar Junction Transistor (BJT), a Metal Oxide Semiconductor Field-Effect Transistor (MOSFET), an Insulated-Gate Bipolar Transistor (IGBT), a Gallium Nitride Field-Effect Transistor (GaN FET), and a Silicon Carbide Field-Effect Transistor (SiC FET). In one embodiment, each of the transistors also includes an anti-parallel diode. The anti-parallel diode is an intrinsic body diode or an external diode.

In operation, the OLRM control circuit 706 controls the first inverter circuit 707 to operate as a voltage source. The transmitter circuit 701 of FIG. 7 provides more robust voltage source input control due to realizing the first inverter circuit 707 as a full-bridge inverter. The OLRM control circuit 706 controls transistors 721, 722, 723, and 724 to receive a DC voltage from DC-to-DC power converter circuit 716 and output a high frequency AC voltage which provides magnetic coupling characteristics that enable wireless power transfer. The DC-to-DC power converter circuit 716 is controlled to maintain the transmitter current $I_{IN}$ at a constant RMS (Root Mean Square) value.

The DC-to-DC power converter circuit 716 provides the transmitter circuit 701 of FIG. 7 with more robust power control because the voltage and input at the input stage of the first inverter circuit 707 is controlled by appropriate commands to the DC-to-DC power converter circuit 716. The OLRM control circuit 706 configures the transmitter current $I_{IN}$ by supplying a command via the multi-bit digital control signal G13 to the DC-to-DC power converter circuit 716. In one embodiment, if the OLRM control circuit 706 detects the transmitter current $I_{IN}$ is above a threshold, then the OLRM control circuit 706 controls the DC-to-DC power converter circuit 716 to decrease the output voltage. If, on the other hand, the OLRM control circuit 706 detects the transmitter current $I_{IN}$ is below a threshold, then the OLRM control circuit 706 controls the DC-to-DC power converter circuit 716 to increase the output voltage.

The OLRM control circuit 706 supplies gating signal G1 to transistor 721, gating signal G2 to transistor 722, gating signal G7 to transistor 723, gating signal G8 to transistor 724, gating signal G3 to transistor 731, gating signal G4 to transistor 732, gating signal G9 to transistor 733, gating signal G10 to transistor 734, gating signal G5 to transistor 741, gating signal G6 to transistor 742, gating signal G11 to transistor 743, gating signal G12 to transistor 744, and a multi-bit digital control signal G13 to the DC-to-DC power converter circuit 716.

The OLRM control circuit 706 achieves reactance matching by generating ninety-degree (90°) lead and lag phase shifted versions of the control signals that control transistors 721, 722, 723, and 724 of the first inverter circuit 707. The ninety-degree (90°) lead version signals are supplied to and control transistors of the second inverter circuit 708. The ninety-degree (90°) lag version signals are supplied to and control transistors of the third inverter circuit 709. By controlling the second and third inverter circuits 708 and 709 in this way, reactance matching is achieved. The current sense circuit 712, capacitor 710, switch 711, voltage sense circuits 736 and 746, and synchronization signal SYNC 715 provide similar optional functionality as in the system 100 shown in FIG. 3.

In one example, OLRM control circuit 706 generates gate control signal G3 to be 90 degrees lead phase shifted with respect to gate control signal G1, and generates gate control signal G5 to be 90 degrees lag phase shifted with respect to gate control signal G1. OLRM control circuit 706 generates gate control signal G9 to be 90 degrees lag phase shifted with respect to gate control signal G7, and generates gate control signal G11 to be 90 degrees lead phase shifted with respect to gate control signal G9. Additionally, OLRM control circuit 706 generates gate control signal G4 to be 90 degrees lead phase shifted with respect to gate control signal G2, and generates gate control signal G10 to be 90 degrees lead phase shifted with respect to gate control signal G8. OLRM control circuit 706 generates gate control signal G6 to be 90 degrees lag phase shifted with respect to gate control signal G2, and generates gate control signal G12 to be 90 degrees lag phase shifted with respect to gate control signal G8.

Figure 8:
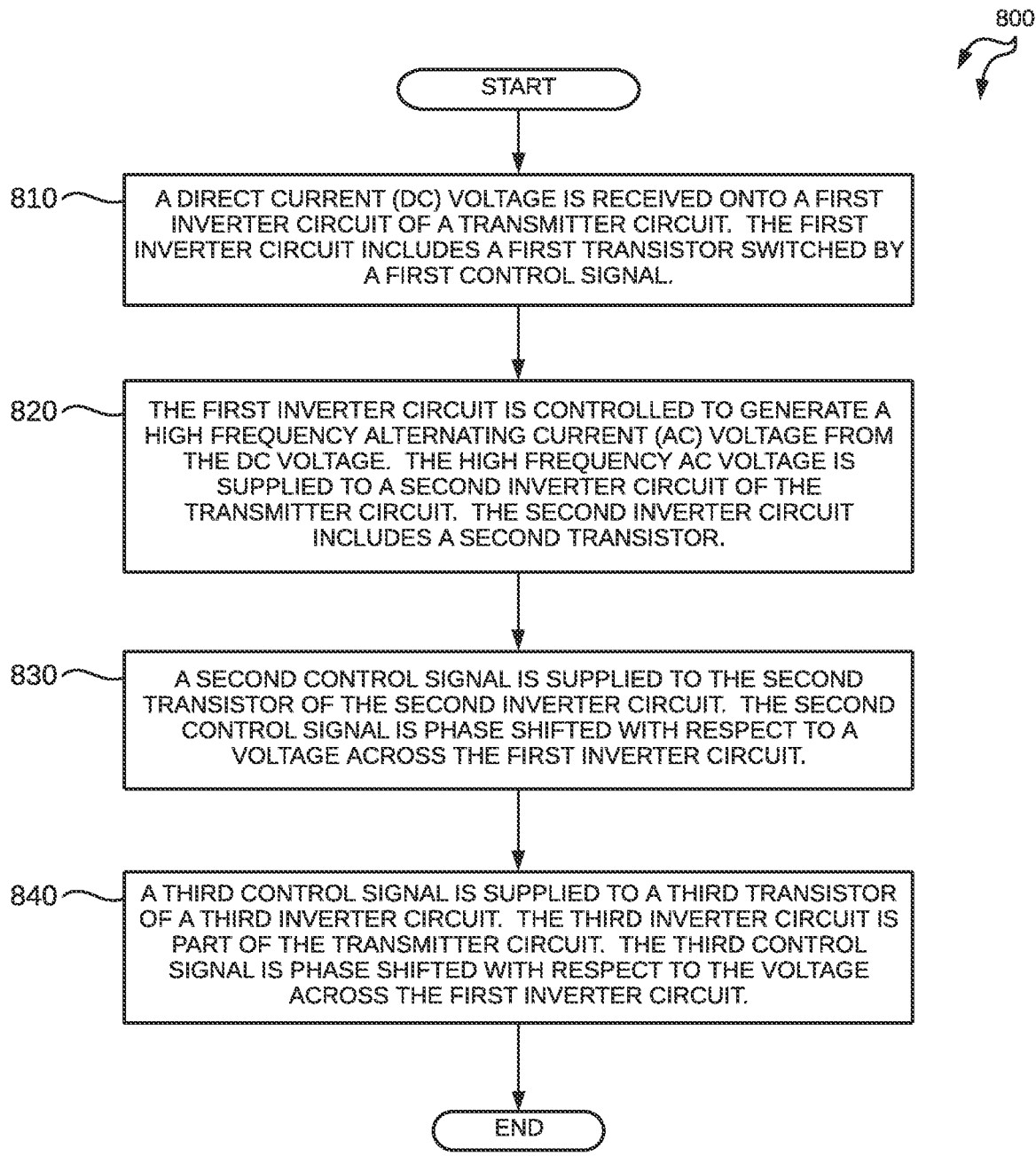
FIG. 8 is a flowchart of a method 800 in accordance with at least one novel aspect.

FIG. 8 is a flowchart of a method 800 in accordance with at least one novel aspect. In a first step (step 810), DC voltage is received onto a first inverter of a transmitter circuit. The first inverter circuit includes a first transistor switched by a first control signal. In a second step (step 820), the first inverter circuit is controlled to generate a high frequency AC voltage from the DC voltage. The high frequency AC voltage is supplied to a second inverter circuit of the transmitter circuit. The second inverter circuit includes a second transistor. In a third step (step 830), a second control signal is supplied to the second transistor of the second inverter circuit. The second control signal is phase shifted with respect to a voltage across the first inverter circuit. In a fourth step (step 840), a third control signal is supplied to a third transistor of a third inverter circuit. The third inverter circuit is part of the transmitter circuit. The third control signal is phase shifted with respect to the voltage across the first inverter circuit.

Figure 9:
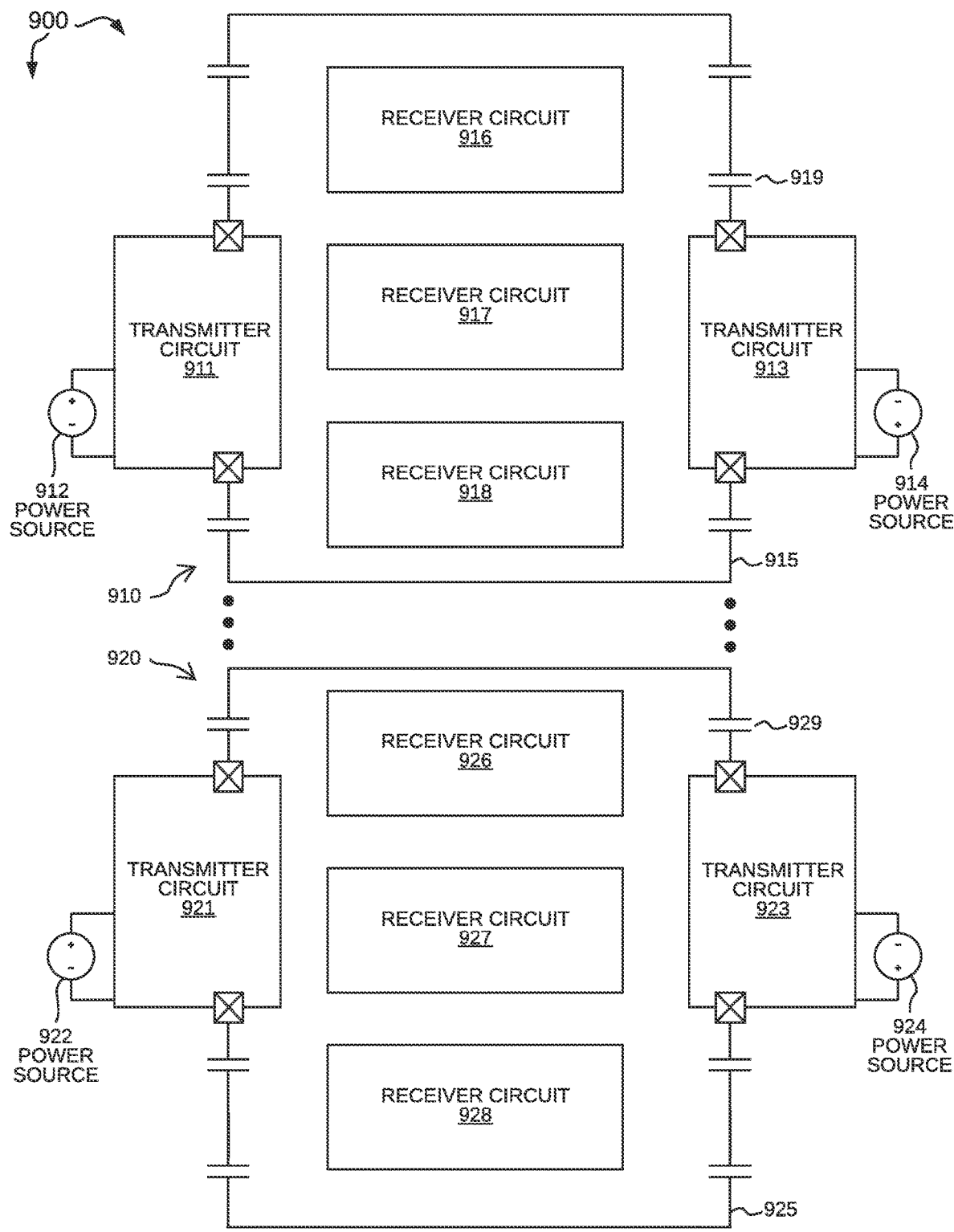
FIG. 9 is a diagram of a wireless power transfer system 900.

FIG. 9 is a diagram of a system 900 comprising a first wireless power transfer system 910 and a second wireless power transfer system 920. The first wireless power transfer system 910 includes a first transmitter circuit 911 supplied by a DC power source 912, a second transmitter circuit 913 supplied by a DC power source 914, a conductor 915, and receiver circuits 916, 917, and 918. The conductor 915 includes a plurality of distributed capacitances coupled in series with conductor 915. Reference numeral 919 identifies one such distributed capacitance. For optimal power transfer, the receiver circuits 916, 917, and 918 are adjacent to and enclosed by the conductor 915.

The second wireless power transfer system 920 includes a first transmitter circuit 921 supplied by a DC power source 922, a second transmitter circuit 923 supplied by a DC power source 924, a conductor 925, and receiver circuits 926, 927, and 928. The conductor 925 includes a plurality of distributed capacitances coupled in series with conductor 925. Reference numeral 929 identifies one such distributed capacitance. For optimal power transfer, the receiver circuits 926, 927, and 928 are adjacent to and enclosed by the conductor 925.

Receiver circuits 916, 917, and 918 are wirelessly supplied by transmitter circuits 911 and 913 via conductor 915. The transmitter circuits 911 and 913 are synchronously controlled in a wired or wireless fashion as explained above in connection with transmitter 101. The transmitter current and voltage output by each transmitter 911 and 913 are in phase with each other. Receiver circuits 926, 927, and 928 are wirelessly supplied by transmitter circuits 921 and 923 via conductor 925. The transmitter circuits 921 and 923 are synchronously controlled in a wired or wireless fashion as explained above in connection with transmitter 101. The transmitter current and voltage output by each transmitter 921 and 923 are in phase with each other. The receiver circuits 916, 917, and 918 may travel near wireless power transfer system 920 and wirelessly receive power via conductor 925. The receiver circuits 926, 927, and 928 may travel near wireless power transfer system 910 and wirelessly receive power via conductor 915.

Figure 10:
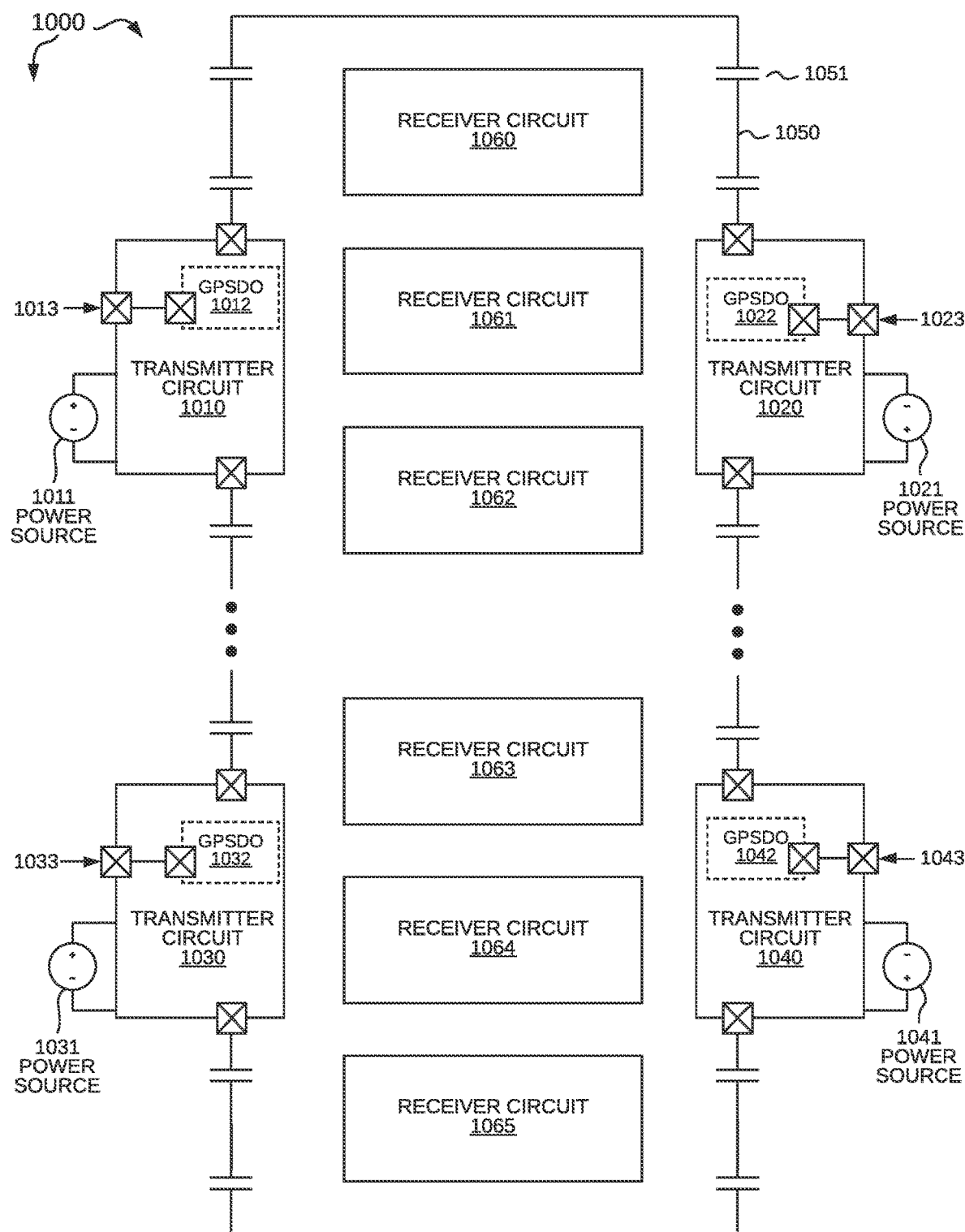
FIG. 10 is a diagram of a wide area wireless power transfer system 1000.

FIG. 10 is a diagram of a wide area wireless power transfer system 1000. The wireless power transfer system 1000 comprises a first transmitter circuit 1010 supplied by a DC power source 1011, a second transmitter circuit 1020 supplied by a DC power source 1021, a third transmitter circuit 1030 supplied by a DC power source 1031, a fourth transmitter circuit 1040 supplied by a DC power source 1041, a conductor 1050, and receiver circuits 1060, 1061, 1062, 1063, 1064, and 1065.

The transmitter circuits 1010, 1020, 1030, and 1040 are switched in a synchronous fashion to ensure reactance matching is achieved in accordance with various embodiments described above. The first transmitter circuit 1010 includes a synchronization circuit 1012 that receives a synchronization signal SYNC1 1013. The second transmitter circuit 1020 includes a synchronization circuit 1022 that receives a synchronization signal SYNC2 1023. The third transmitter circuit 1030 includes a synchronization circuit 1032 that receives a synchronization signal SYNC3 1033. The fourth transmitter circuit 1040 includes a synchronization circuit 1042 that receives a synchronization signal SYNC4 1024. In one example, the synchronization circuits are realized as Global Positioning System Disciplined Oscillators (GPSDOs).

In one embodiment, each of the receiver circuits 1060-1065 is part of an electric vehicle. The conductor 1050 extends along a roadway. As electric vehicles travel along the roadway, each vehicle is wirelessly charged or receives power via the conductor 1050. Each electric vehicle is operated by a power consuming entity that registers with a wireless power providing entity. The wireless power providing entity monitors wireless power transferred to the vehicle and communicates a financial charge to the power consuming entity.

Figure 11:
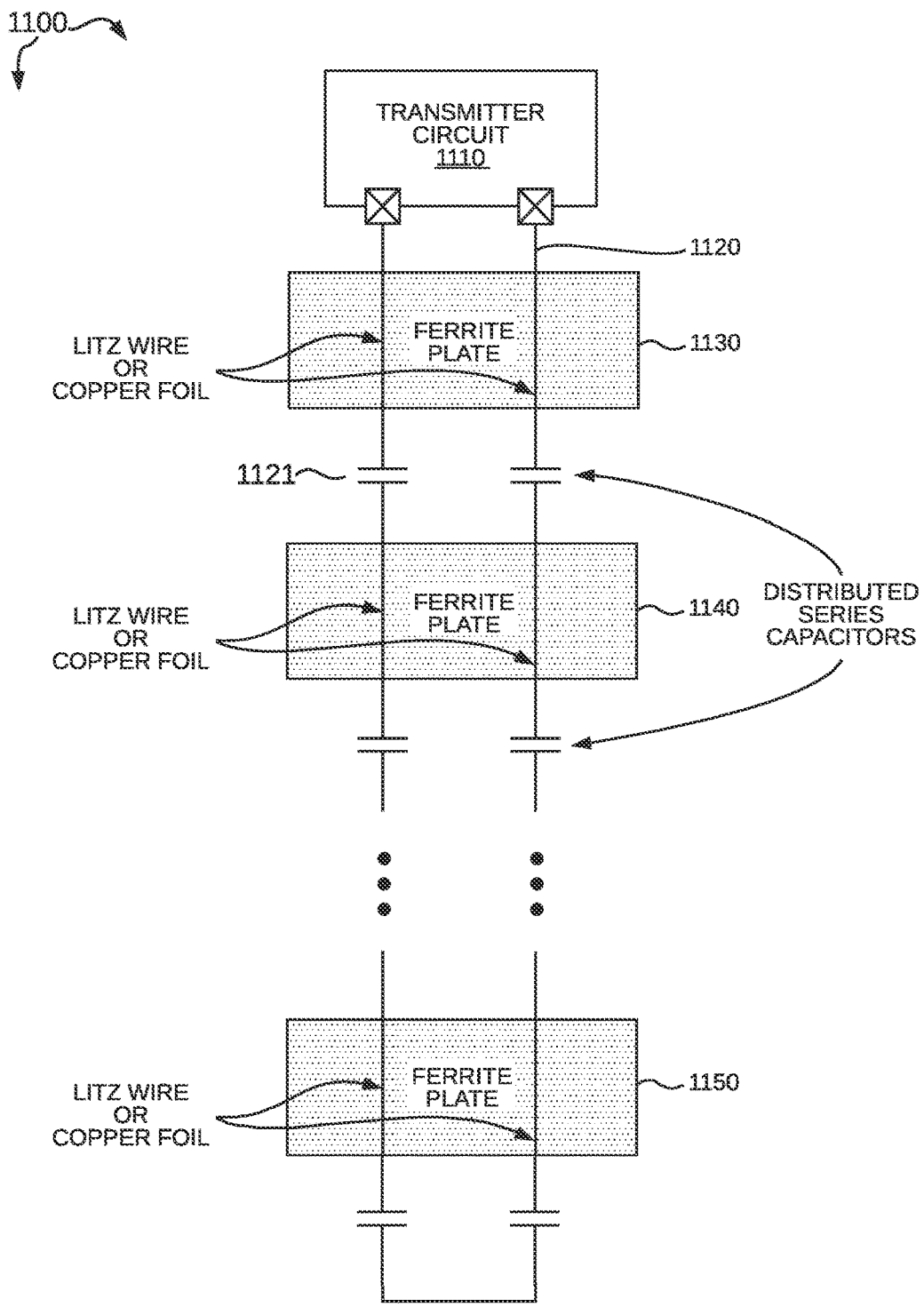
FIG. 11 is a diagram of a system 1100.

FIG. 11 is a diagram of a system 1100 having ferrite plates 1130, 1140, and 1150. System 1100 includes a transmitter circuit 1110, a conductor 1120, and ferrite plates 1130, 1140, and 1150. The conductor 1120 includes a plurality of distributed capacitances coupled in series. Reference numeral 1121 identifies one such distributed capacitance. Each of the ferrite plates 1130, 1140, and 1150 are adjacent to the conductor 1120. The ferrite plates reduce air gap and transmitter current thereby improving wireless power transfer efficiency of the system 1100. The ferrite plates are optional and are excluded in other embodiments.

Figure 12:
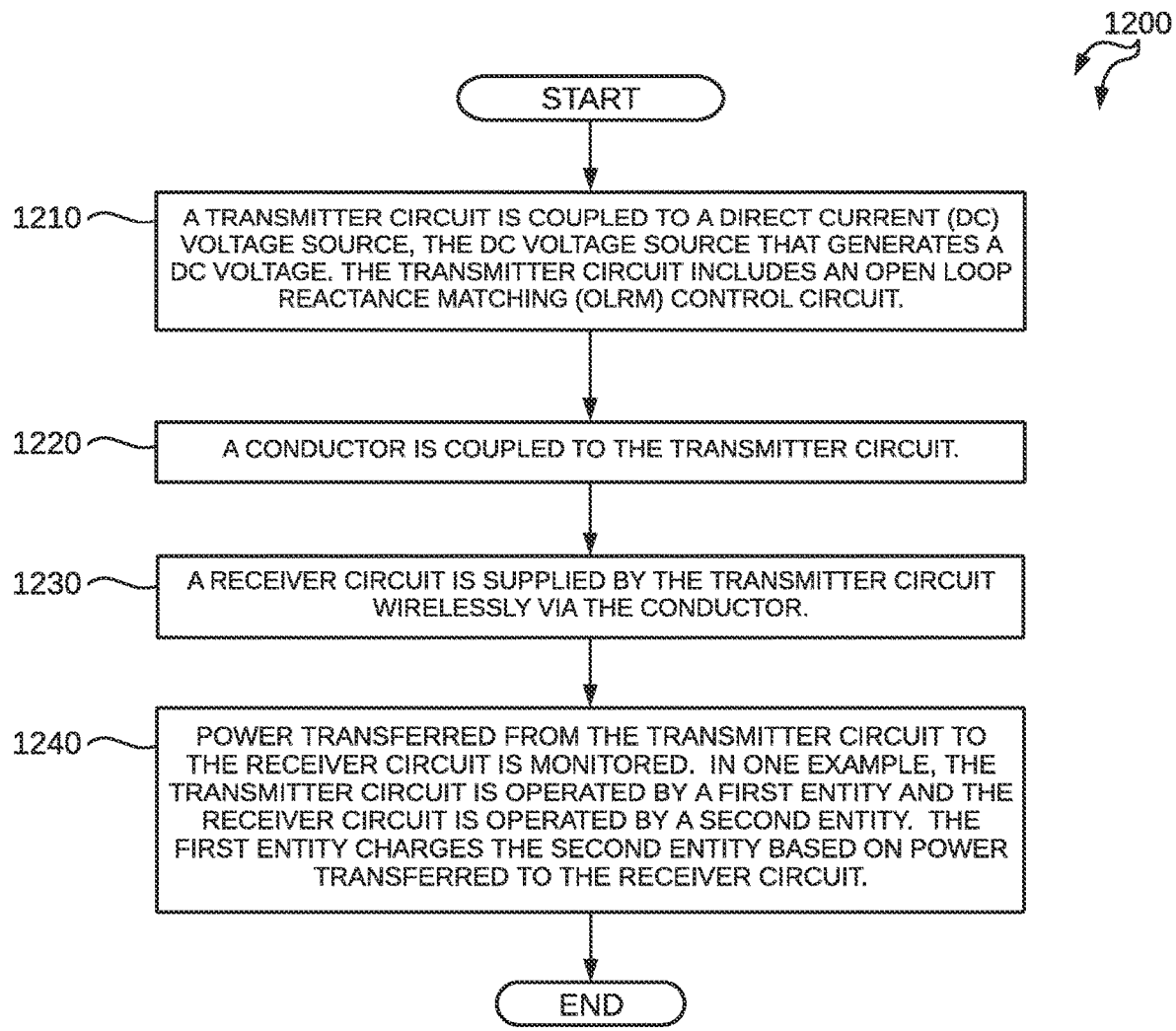
FIG. 12 is a flowchart of a method 1200 in accordance with another novel aspect.

FIG. 12 is a flowchart of a method 1200 in accordance with at least one novel aspect. In a first step (step 1210), a transmitter circuit is coupled to a DC voltage source, the DC voltage source that generates a DC voltage. The transmitter circuit includes an open loop reactance matching (OLRM) control circuit. In a second step (1220), a conductor is coupled to the transmitter circuit. In a third step (1230), the transmitter circuit wirelessly supplies a receiver circuit via the conductor. In a fourth step (1240), the power transferred from the transmitter circuit to the receiver circuit is monitored. In one example, the transmitter circuit is operated by a first entity and the receiver circuit is operated by a second entity. The first entity charges the second entity based on power transferred to the receiver circuit.

Figure 13:
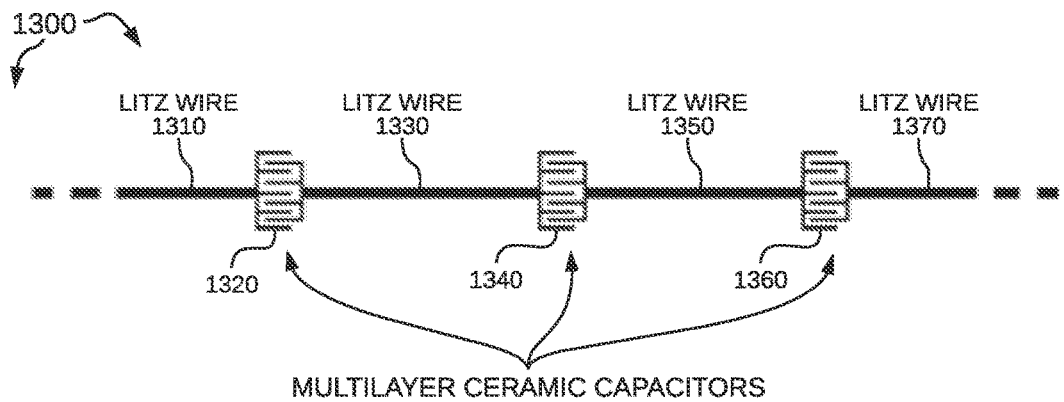
FIG. 13 is a diagram of a conductor 1300.

FIG. 13 is a diagram of a conductor 1300. The conductor 1300 is usable with any of the above described power transmitter circuits. Conductor 1300 includes Litz wires 1310, 1330, 1350, and 1370 and a plurality of multilayer ceramic capacitors 1320, 1340, and 1360. Each of the multilayer ceramic capacitors 1320, 1340, and 1360 is coupled in series with the Litz wires 1310, 1330, 1350, and 1370. The multilayer ceramic capacitor 1320 is coupled in series between portions 1330 and 1310 of conductor 1300. The multilayer ceramic capacitor 1340 is coupled in series between portions 1350 and 1330 of conductor 1300. The multilayer ceramic capacitor 1360 is coupled in series between portions 1370 and 1350 of conductor 1300.

Figure 14:
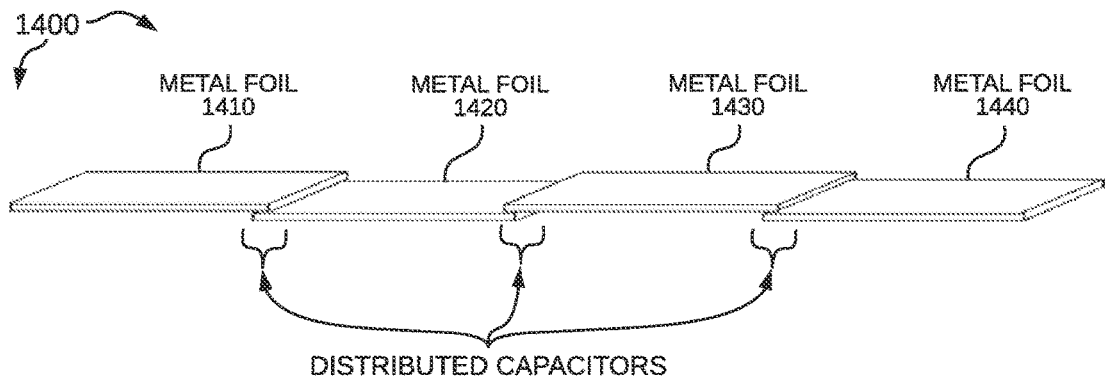
FIG. 14 is a diagram of a conductor 1400.

FIG. 14 is a diagram of a conductor 1400. The conductor 1400 is usable with any of the above described power transmitter circuits. Conductor 1400 includes metal foils 1410, 1420, 1430, and 1440. Each of the metal foils 1410, 1420, 1430, and 1440 is capacitively coupled together via a dielectric material layer. For example, a dielectric material layer is present where metal foil 1410 overlaps with metal foil 1420. The dielectric material layer is sandwiched between an overlapping region between metal foil 1410 and metal foil 1420. The dielectric material layer forms a capacitance. Each metal foil of the conductor 1400 is capacitively coupled in a similar fashion thereby providing a plurality of distributed capacitances at each junction coupled in series with each other. Each metal foil of the conductor 1400 is formed from aluminum, copper, or a metal alloy comprising aluminum or copper. Conductor 1400 provides a cost-effective conductor as compared to conventionally available power transmission conductors.

Figure 15:
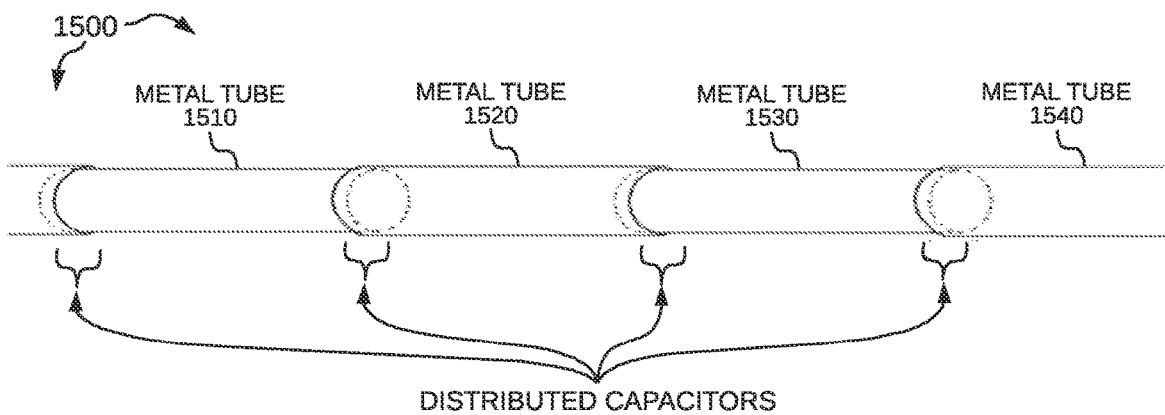
FIG. 15 is a diagram of a conductor 1500.

FIG. 15 is a diagram of a conductor 1500. The conductor 1500 is usable with any of the above described power transmitter circuits. Conductor 1500 includes metal tubes 1510, 1520, 1530, and 1540. Each of the metal tubes 1510, 1520, 1530, and 1540 is capacitively coupled together via a dielectric material layer. For example, a dielectric material layer is present where metal tube 1510 overlaps with metal tube 1520. The dielectric material layer is sandwiched between an overlapping region between metal tube 1510 and metal tube 1520. The dielectric material layer forms a capacitance. Each metal tube of the conductor 1500 is capacitively coupled in a similar fashion thereby providing a plurality of distributed capacitances at each junction coupled in series with each other. Each metal tube of the conductor 1500 is formed from aluminum, copper, or a metal alloy comprising aluminum or copper. Conductor 1500 provides a cost-effective conductor as compared to conventionally available power transmission conductors.

Figure 16:
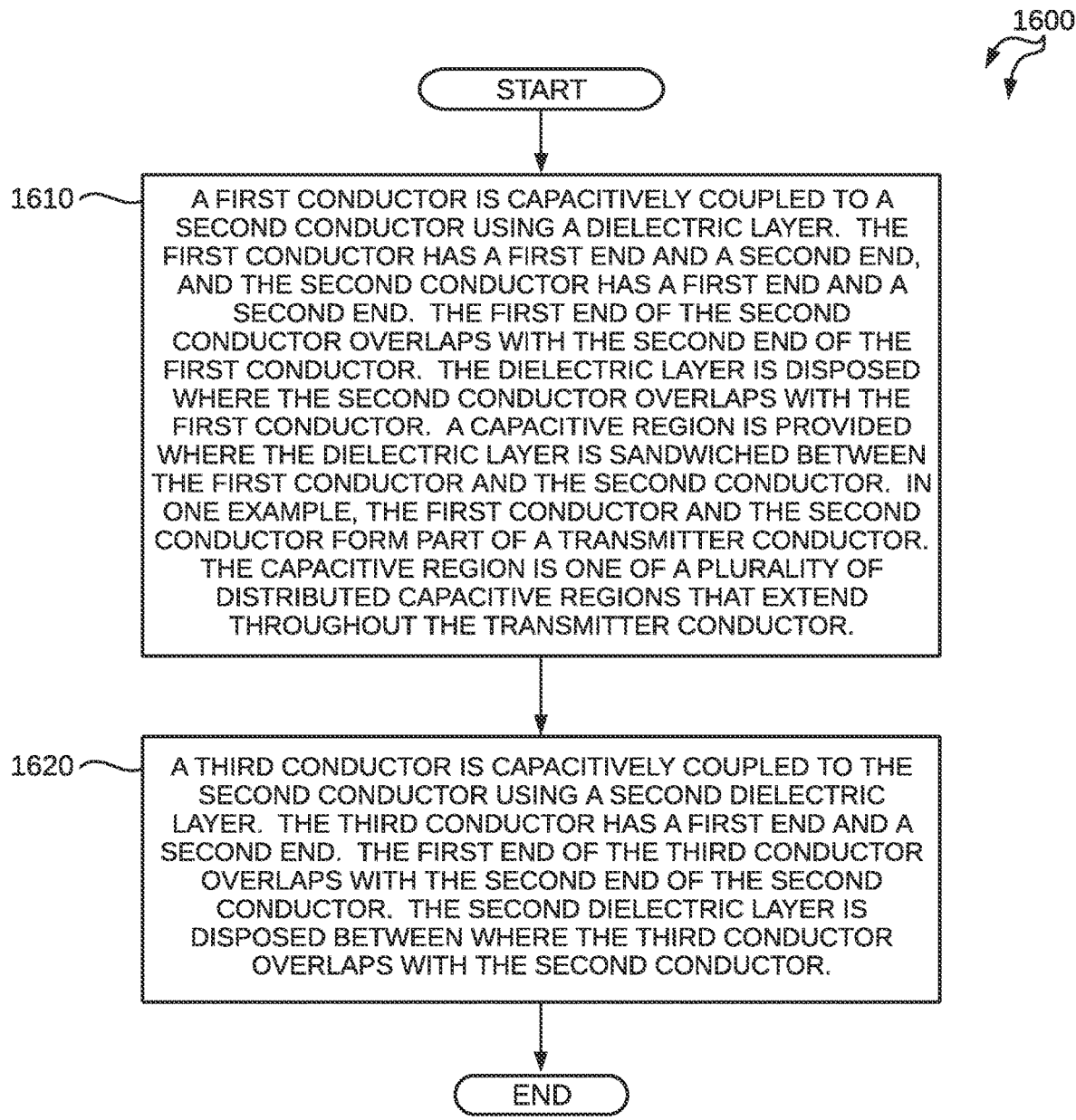
FIG. 16 is a flowchart of a method 1600 in accordance with another novel aspect.

FIG. 16 is a flowchart of a method 1600 in accordance with at least one novel aspect. In a first step (step 1610), a first conductor is capacitively coupled to a second conductor using a dielectric layer. The first conductor has a first end and a second end. The second conductor has a first end and a second end. The first end of the second conductor overlaps with the second end of the first conductor. The dielectric layer is disposed where the second conductor overlaps with the first conductor. A capacitive region is provided where the dielectric layer is disposed between the first conductor and the second conductor. In one example, the first conductor and the second conductor form part of a transmitter conductor. The capacitive region is one of a plurality of distributed capacitive regions that extend throughout the transmitter conductor. In a second step (step 1620), a third conductor is capacitively coupled to the second conductor using a second dielectric layer. The third conductor has a first end and a second end. The first end of the third conductor overlaps with the second end of the second conductor. The second dielectric layer is disposed between where the third conductor overlaps with the second conductor.

Figure 17:
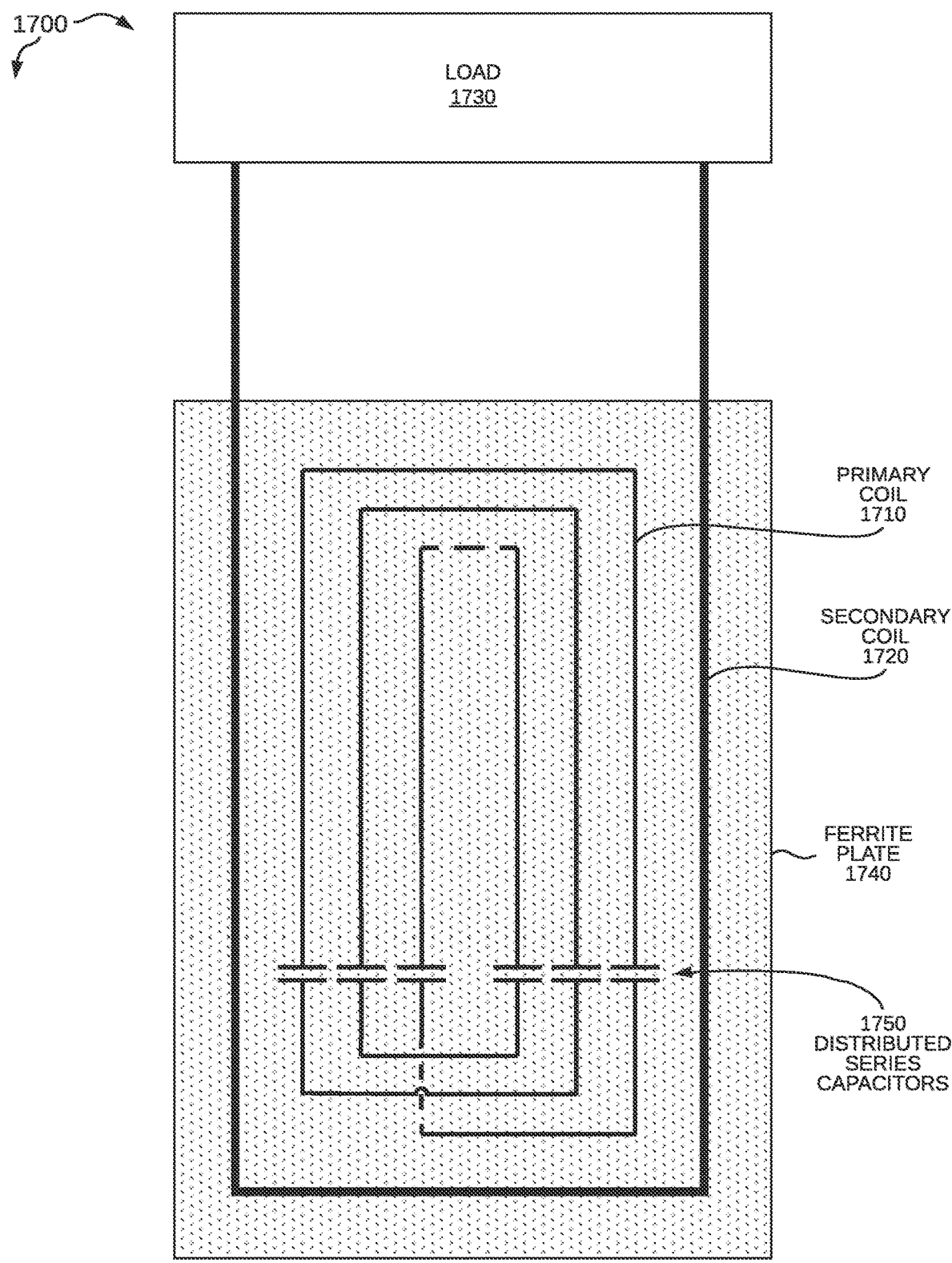
FIG. 17 is a diagram of a receiver circuit 1700 in accordance with one embodiment.

FIG. 17 is a diagram of a receiver circuit 1700 in accordance with one embodiment. The receiver circuit 1700 is operable to wirelessly receive power from any of the above disclosed transmitter circuits. The receiver circuit 1700 comprises a primary coil 1710, a secondary coil 1720, a load 1730, and a ferrite plate 1740. The primary coil 1710 has two or more turns. The primary coil 1710 comprises at least one capacitance in series with the primary coil 1710. Reference number 1750 identifies one such distributed series capacitance.

The secondary coil 1720 has at least one turn. The load 1730 is a Direct Current (DC) load or Alternating Current (AC) load. The secondary coil 1720 magnetically couples to the primary coil 1710. The secondary coil 1720 surrounds the primary coil 1710. The secondary coil 1720 does not contact the primary coil 1710. When power is wirelessly transmitted to the receiver circuit 1700, the secondary coil 1730 drives the load 1730.

The ferrite plate 1740 is provided adjacent to the primary coil 1710 and to the secondary coil 1720. The ferrite plate 1740 tends to increase efficiency of wireless power transfer to the receiver circuit 1700. In other embodiments, the receiver circuit 1700 does not include any ferrite plate 1740.

Figure 18:
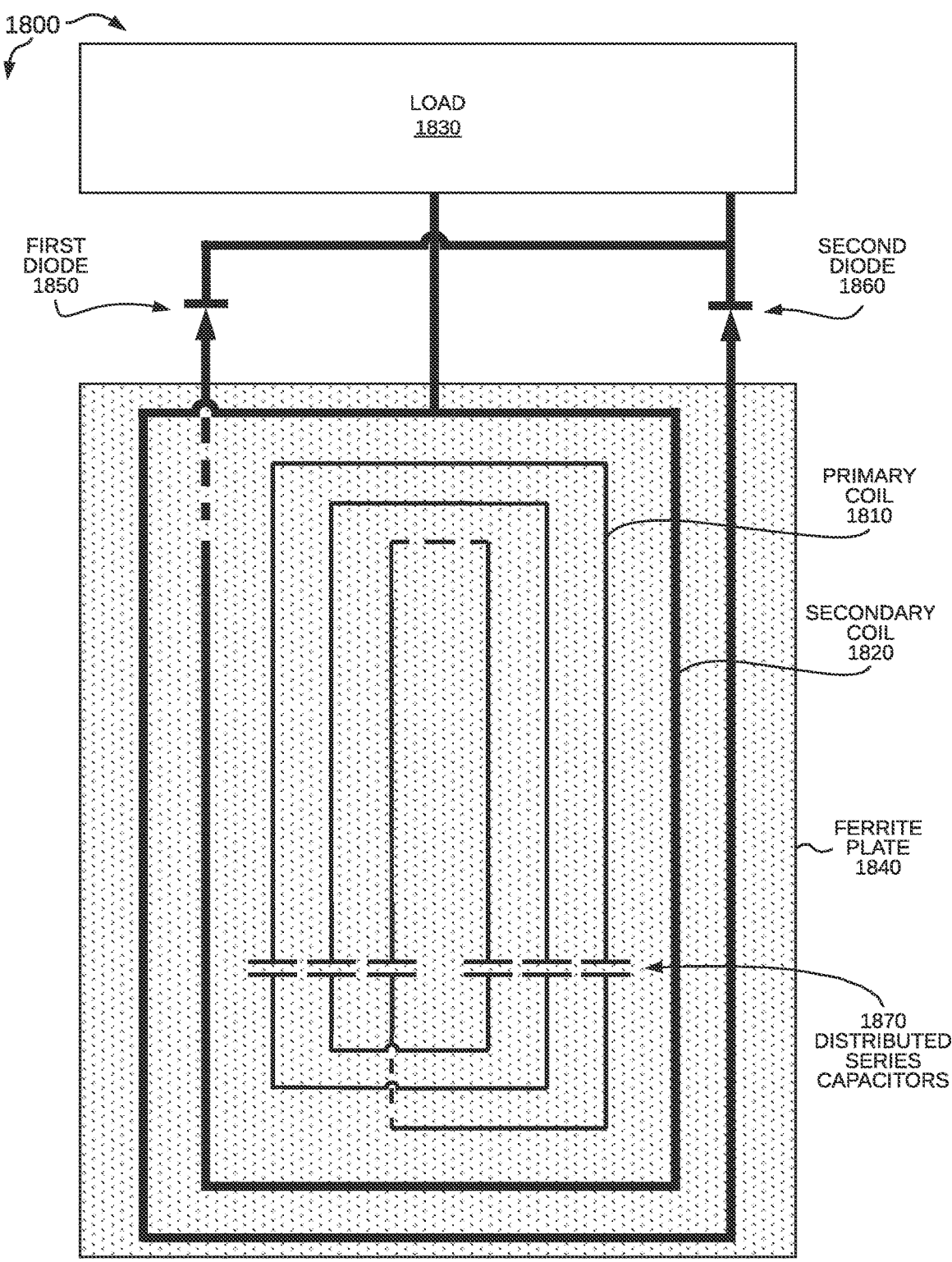
FIG. 18 is a diagram of a receiver circuit 1800 in accordance with another embodiment.

FIG. 18 is a diagram of a receiver circuit 1800 in accordance with another embodiment. The receiver circuit 1800 is operable to wirelessly receive power from any of the above disclosed transmitter circuits. The receiver circuit 1800 comprises a primary coil 1810, a secondary coil 1820, a load 1830, a ferrite plate 1840, a first diode 1850, and a second diode 1860. The primary coil 1810 has two or more turns. The primary coil 1810 comprises at least one capacitance in series with the primary coil 1810. Reference number 1870 identifies one such distributed series capacitance.

The secondary coil 1820 has two turns. One end of the secondary coil 1820 is coupled to the first diode 1850.

Another end of the secondary coil 1820 is coupled to the second diode 1860. The load 1830 is a Direct Current (DC) load. The secondary coil 1820 magnetically couples to the primary coil 1810. The secondary coil 1820 surrounds the primary coil 1810. The secondary coil 1820 does not contact the primary coil 1810. When power is wirelessly transmitted to the receiver circuit 1800, the secondary coil 1830 drives the DC load 1830 via the first and second diodes 1850 and 1860.

The ferrite plate 1840 is provided adjacent to the primary coil 1810 and to the secondary coil 1820. The ferrite plate 1840 tends to increase efficiency of wireless power transfer to the receiver circuit 1800. In other embodiments, the receiver circuit 1800 is provided without any ferrite plate 1840.

Figure 19:
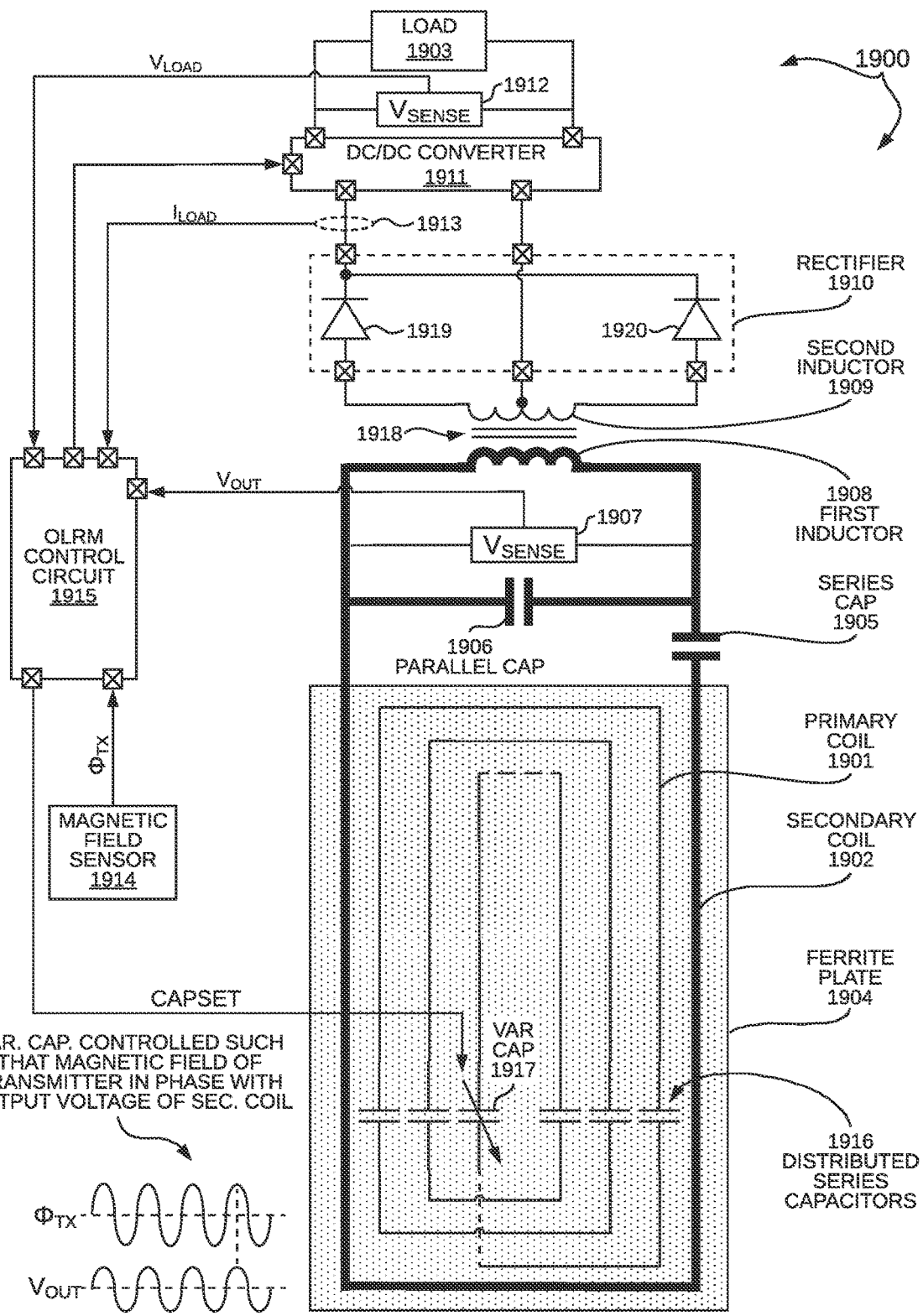
FIG. 19 is a diagram of a receiver circuit 1900 in accordance with another embodiment.

FIG. 19 is a diagram of a receiver circuit 1900 in accordance with another embodiment. The receiver circuit 1900 is operable to wirelessly receive power from any of the above disclosed transmitter circuits. The receiver circuit 1900 comprises a primary coil 1901, a secondary coil 1902, a load 1903, a ferrite plate 1904, a series capacitor 1905, a parallel capacitor 1906, a voltage sensor 1907, a first inductor 1908, a second inductor 1909, a rectifier circuit 1910, a DC-to-DC power converter circuit 1911, a voltage sense circuit 1912, a current sense circuit 1913, a magnetic field sense circuit 1914, and an Open Loop Reactance Matching (OLRM) control circuit 1915.

The primary coil 1901 has two or more turns. The primary coil 1901 comprises at least one capacitance in series with the primary coil 1901 and at least one variable capacitance in series with the primary coil 1901. Reference number 1916 identifies one such distributed series capacitance. Reference number 1917 identifies one such distributed series variable capacitance. Controller circuit 1915 sets a capacitance of the variable capacitance 1917 via a digital signal CAPSET.

The secondary coil 1902 has one turn. One end of the secondary coil 1902 is capacitively coupled to an end of the first inductor 1908 via the series capacitor 1905. Another end of the secondary coil 1902 is coupled to an opposite end of the first inductor 1908. A parallel capacitor 1906 is coupled between ends of secondary coil 1902. A voltage sense circuit 1907 is coupled between ends of the first inductor 1908.

The ferrite plate 1904 is provided adjacent to the primary coil 1901 and to the secondary coil 1902. The ferrite plate 1904 tends to increase efficiency of wireless power transfer to the receiver circuit 1900. In other embodiments, the receiver circuit 1900 is provided without any ferrite plate 1904.

The load 1903 is a Direct Current (DC) load. The secondary coil 1902 magnetically couples to the primary coil 1901. The secondary coil 1902 surrounds the primary coil 1901. The secondary coil 1902 does not contact the primary coil 1901. When power is wirelessly transmitted to the receiver circuit 1900, the secondary coil 1903 supplies the DC load 1903 via internal circuitry described in detail below.

The first inductor 1908, the second inductor 1909, and a magnetic core 1918 form a transformer that isolates a source side having the primary and secondary coils 1901 and 1902 from a load side having the load 1903. The first inductor 1908 magnetically couples to the second inductor 1909. Ends of the second inductor 1909 are coupled to a rectifier 1910. The rectifier 1910 includes a first diode 1919 and a second diode 1920. The rectifier supplies a voltage to the DC-to-DC power converter circuit 1911. The DC-to-DC power converter circuit 1911 in turn supplies the load 1903.

During operation, the OLRM control circuit 1915 receives secondary coil output voltage information, load current and voltage information, and magnetic field information. The voltage sense circuit 1907 generates a voltage sense signal $V_{OUT}$ indicative of an output voltage of the secondary coil 1902. The voltage sense signal $V_{OUT}$ is supplied to the OLRM control circuit 1915. The magnetic field sense circuit 1914 generates and outputs a magnetic field sense signal $\Phi_{TX}$ indicative of magnetic field of a transmitter circuit. The magnetic field sense signal $\Phi_{TX}$ is supplied to the OLRM control circuit 1915. A current sense circuit 1913 generates a current sense signal $I_{LOAD}$ indicative of a current level at an input stage of the DC-to-DC power converter circuit 1911. The current sense signal $I_{LOAD}$ is supplied to the OLRM control circuit 1915. A voltage sense circuit 1912 generates a voltage sense signal $V_{LOAD}$ indicative of a voltage level at an output stage of the DC-to-DC power converter circuit 1911. The voltage sense signal $V_{LOAD}$ is supplied to the OLRM control circuit 1915.

In operation, a transmitter circuit (not shown) wirelessly transfers power to the receiver circuit 1900. During power transfer, the OLRM control circuit 1915 adjusts the capacitance of the variable capacitor 1917 via control signal CAPSET such that the output voltage of the secondary coil 1902, identified by voltage sense signal $V_{OUT}$, has the same phase as the magnetic field $\Phi_{TX}$ of the transmitter circuit. Matching the phase of the output voltage of the secondary coil 1902, identified by voltage sense signal $V_{OUT}$, with the phase of the magnetic field $\Phi_{TX}$ of the transmitter circuit provides more efficient wireless power transfer than if no phase matching were to be performed.

The OLRM control circuit 1915 controls and regulates the load voltage $V_{LOAD}$. The OLRM control circuit 1915 operates the DC-to-DC power converter 1911 in a boost mode. The OLRM control circuit 1915 receives the current sense signal $I_{LOAD}$ and adjusts the DC-to-DC power converter 1911 to maintain the input current $I_{LOAD}$ to have the same phase as the output voltage $V_{OUT}$ in a Power Factor Correction (PFC) control mode.

Figure 20:
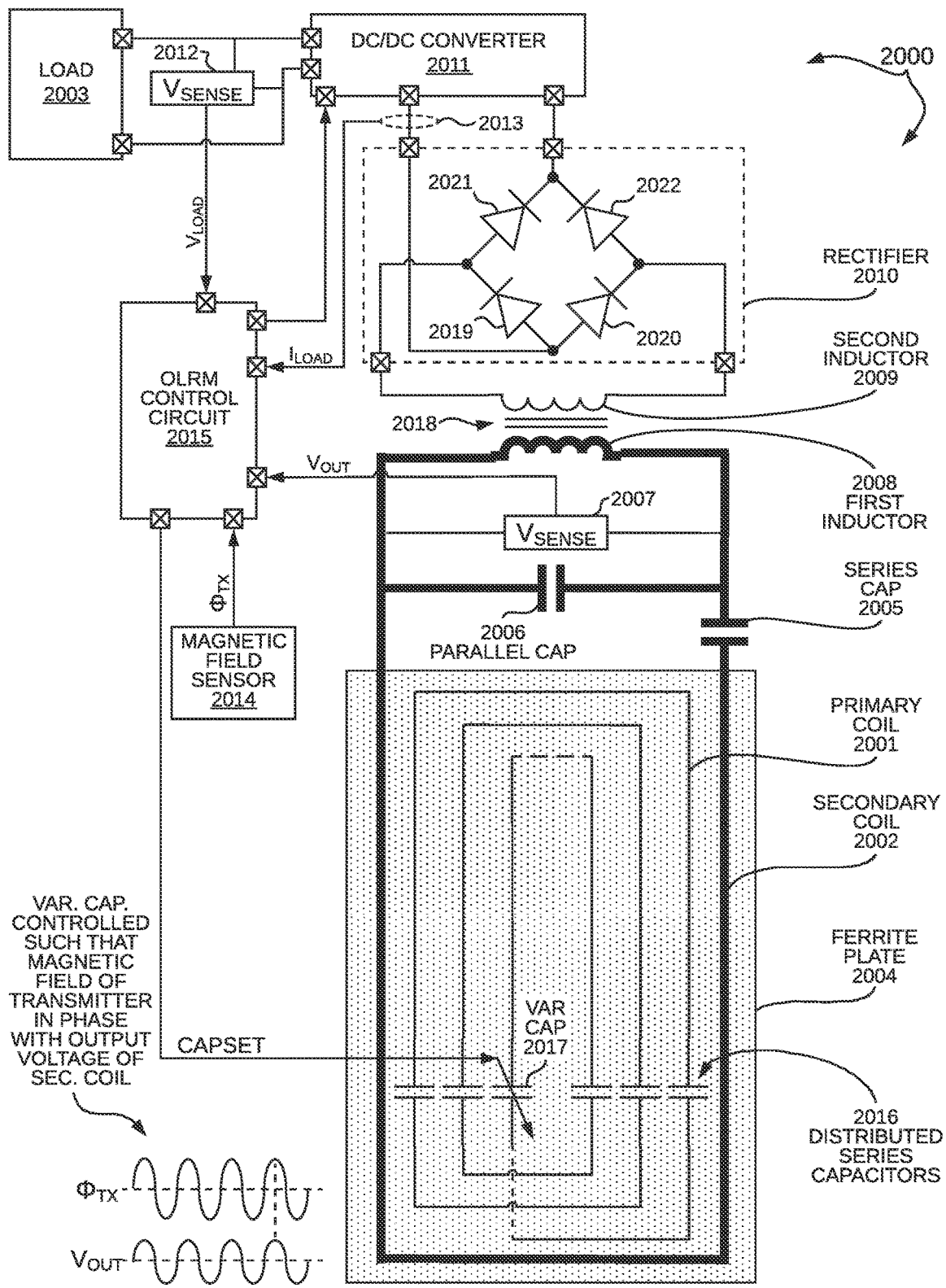
FIG. 20 is a diagram of a receiver circuit 2000 in accordance with another embodiment.

FIG. 20 is a diagram of a receiver circuit 2000 in accordance with another embodiment. The receiver circuit 2000 is operable to wirelessly receive power from any of the above disclosed transmitter circuits. The receiver circuit 2000 comprises a primary coil 2001, a secondary coil 2002, a load 2003, a ferrite plate 2004, a series capacitor 2005, a parallel capacitor 2006, a voltage sensor 2007, a first inductor 2008, a second inductor 2009, a rectifier circuit 2010, a DC-to-DC power converter circuit 2011, a voltage sense circuit 2012, a current sense circuit 2013, a magnetic field sense circuit 2014, and an Open Loop Reactance Matching (OLRM) control circuit 2015.

The primary coil 2001 has two or more turns. The primary coil 2001 comprises at least one capacitance in series with the primary coil 2001 and at least one variable capacitance in series with the primary coil 2001. Reference number 2016 identifies one such distributed series capacitance. Reference number 2017 identifies one such distributed series variable capacitance. Controller circuit 2015 sets a capacitance of the variable capacitance 2017 via a digital signal CAPSET.

The secondary coil 2002 has one turn. One end of the secondary coil 2002 is capacitively coupled to an end of the first inductor 2008 via the series capacitor 2005. Another end of the secondary coil 2002 is coupled to an opposite end of the first inductor 2008. A parallel capacitor 2006 is coupled between ends of secondary coil 2002. A voltage sense circuit 2007 is coupled between ends of the first inductor 2008.

The ferrite plate 2004 is provided adjacent to the primary coil 2001 and to the secondary coil 2002. The ferrite plate 2004 tends to increase efficiency of wireless power transfer to the receiver circuit 2000. In other embodiments, the receiver circuit 2000 is provided without any ferrite plate 2004.

The load 2003 is a Direct Current (DC) load. The secondary coil 2002 magnetically couples to the primary coil 2001. The secondary coil 2002 surrounds the primary coil 2001. The secondary coil 2002 does not contact the primary coil 2001. When power is wirelessly transmitted to the receiver circuit 2000, the secondary coil 2003 supplies the DC load 2003 via internal circuitry described in detail below.

The first inductor 2008, the second inductor 2009, and a magnetic core 2018 form a transformer that isolates a source side having the primary and secondary coils 2001 and 2002 from a load side having the load 2003. The first inductor 2008 magnetically couples to the second inductor 2009. Ends of the second inductor 2009 are coupled to a rectifier 2010. The rectifier 2010 is a four-terminal device and includes a first diode 2019, a second diode 2020, a third diode 2021, and a fourth diode 2022. The rectifier 2010 supplies a voltage to the DC-to-DC power converter circuit 2011. The DC-to-DC power converter circuit 2011 in turn supplies the load 2003.

During operation, the OLRM control circuit 2015 receives secondary coil output voltage information, load current and voltage information, and magnetic field information. The voltage sense circuit 2007 generates a voltage sense signal $V_{OUT}$ indicative of an output voltage of the secondary coil 2002. The voltage sense signal $V_{OUT}$ is supplied to the OLRM control circuit 2015. The magnetic field sense circuit 2014 generates and outputs a magnetic field sense signal $\Phi_{TX}$ indicative of magnetic field of a transmitter circuit. The magnetic field sense signal $\Phi_{TX}$ is supplied to the OLRM control circuit 2015. A current sense circuit 2013 generates a current sense signal $I_{LOAD}$ indicative of a current level at an input stage of the DC-to-DC power converter circuit 2011. The current sense signal $I_{LOAD}$ is supplied to the OLRM control circuit 2015. A voltage sense circuit 2012 generates a voltage sense signal $V_{LOAD}$ indicative of a voltage level at an output stage of the DC-to-DC power converter circuit 2011. The voltage sense signal $V_{LOAD}$ is supplied to the OLRM control circuit 2015.

In operation, a transmitter circuit (not shown) wirelessly transfers power to the receiver circuit 2000. During power transfer, the OLRM control circuit 2015 adjusts the capacitance of the variable capacitor 2017 via control signal CAPSET such that the output voltage of the secondary coil 2002, identified by voltage sense signal $V_{OUT}$, has the same phase as the magnetic field $\Phi_{TX}$ of the transmitter circuit. Matching the phase of the output voltage of the secondary coil 2002, identified by voltage sense signal $V_{OUT}$, with the phase of the magnetic field $\Phi_{TX}$ of the transmitter circuit provides more efficient wireless power transfer than if no phase matching were to be performed.

The OLRM control circuit 2015 controls and regulates the load voltage $V_{LOAD}$. The OLRM control circuit 2015 operates the DC-to-DC power converter 2011 in a boost mode. The OLRM control circuit 2015 receives the current sense signal $I_{LOAD}$ and adjusts the DC-to-DC power converter 2011 to maintain the input current $I_{LOAD}$ to have the same phase as the output voltage $V_{OUT}$ in a Power Factor Correction (PFC) control mode.

Figure 21:
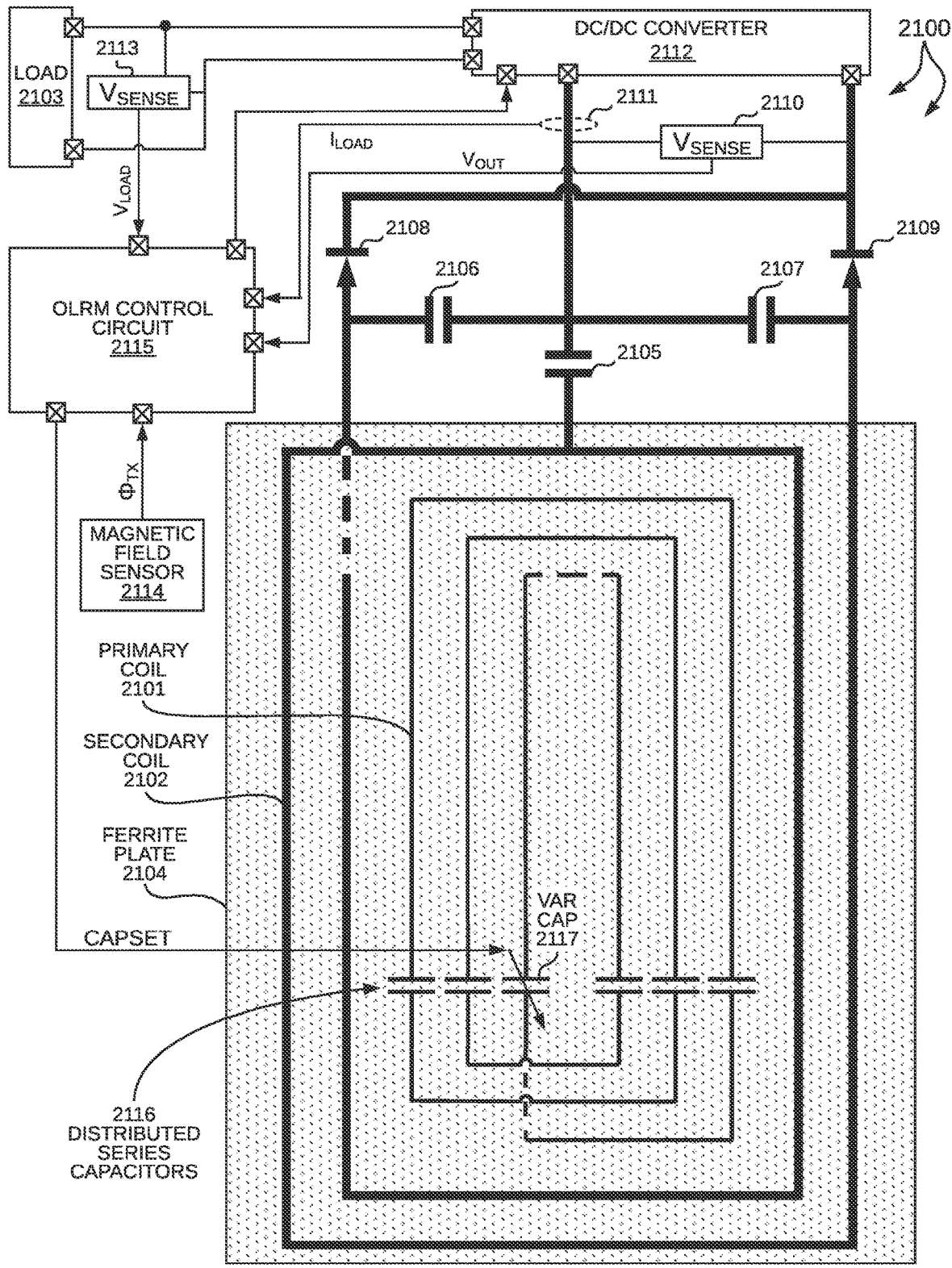
FIG. 21 is a diagram of a receiver circuit 2100 in accordance with another embodiment.

FIG. 21 is a diagram of a receiver circuit 2100 in accordance with another embodiment. The receiver circuit 2100 is operable to wirelessly receive power from any of the above disclosed transmitter circuits. The receiver circuit 2100 comprises a primary coil 210l, a secondary coil 2102, a load 2103, a ferrite plate 2104, a series capacitor 2105, first and second parallel capacitors 2106 and 2107, first and second diodes 2018 and 2109, a voltage sense circuit 2110, a current sense circuit 2111, a DC-to-DC power converter circuit 2112, a voltage sense circuit 2113, a magnetic field sense circuit 2114, and an Open Loop Reactance Matching (OLRM) control circuit 2115.

The primary coil 2101 has two or more turns. The primary coil 2101 comprises at least one capacitance in series with the primary coil 2101 and at least one variable capacitance in series with the primary coil 2101. Reference number 2116 identifies one such distributed series capacitance. Reference number 2117 identifies one such distributed series variable capacitance. Controller circuit 2115 sets a capacitance of the variable capacitance 2117 via a digital signal CAPSET.

The secondary coil 2102 has one turn. One end of the secondary coil 2102 is coupled to the first diode 2108 and another end of the secondary coil 2102 is coupled to the second diode 2109. Outputs of the first and second diodes 2108 and 2109 are coupled to an input of the DC-to-DC power converter circuit 2112. The secondary coil 2102 is also capacitively coupled to another input the DC-to-DC power converter circuit 2112 via capacitor 2105.

The ferrite plate 2104 is provided adjacent to the primary coil 2101 and to the secondary coil 2102. The ferrite plate 2104 tends to increase efficiency of wireless power transfer to the receiver circuit 2100. In other embodiments, the receiver circuit 2100 is provided without any ferrite plate 2104.

The load 2103 is a Direct Current (DC) load. The secondary coil 2102 magnetically couples to the primary coil 2001. The secondary coil 2002 surrounds the primary coil 2001. The secondary coil 2002 does not contact the primary coil 2001. When power is wirelessly transmitted to the receiver circuit 2000, the secondary coil 2003 supplies the DC-to-DC power converter circuit 2011 via the diodes 2108 and 2109. The DC-to-DC power converter circuit 2011 in turn supplies the load 2003.

During operation, the OLRM control circuit 2115 receives secondary coil output voltage information, load current and voltage information, and magnetic field information. The voltage sense circuit 2110 generates a voltage sense signal $V_{OUT}$ indicative of an output voltage of the secondary coil 2102. The voltage sense signal $V_{OUT}$ is supplied to the OLRM control circuit 2115. The magnetic field sense circuit 2114 generates and outputs a magnetic field sense signal $\Phi_{TX}$ indicative of magnetic field of a transmitter circuit. The magnetic field sense signal $\Phi_{TX}$ is supplied to the OLRM control circuit 2115. A current sense circuit 2111 generates a current sense signal $I_{LOAD}$ indicative of a current level at an input stage of the DC-to-DC power converter circuit 2112. The current sense signal $I_{LOAD}$ is supplied to the OLRM control circuit 2115. A voltage sense circuit 2113 generates a voltage sense signal $V_{LOAD}$ indicative of a voltage level at an output stage of the DC-to-DC power converter circuit 2112. The voltage sense signal $V_{LOAD}$ is supplied to the OLRM control circuit 2115.

In operation, a transmitter circuit (not shown) wirelessly transfers power to the receiver circuit 2100. During power transfer, the OLRM control circuit 2115 adjusts the capacitance of the variable capacitor 2117 via control signal CAPSET such that the output voltage of the secondary coil 2102, identified by voltage sense signal $V_{OUT}$, has a same phase as the magnetic field $\Phi_{TX}$ of the transmitter circuit.

Matching the phase of the output voltage of the secondary coil 2102, identified by voltage sense signal $V_{OUT}$, with the phase of the magnetic field $\Phi_{TX}$ of the transmitter circuit provides more efficient wireless power transfer than if no phase matching were to be performed.

The OLRM control circuit 2115 controls and regulates the load voltage $V_{LOAD}$. The OLRM control circuit 2115 operates the DC-to-DC power converter 2112 in a buck or boost mode. The OLRM control circuit 2115 receives the current sense signal $I_{LOAD}$ and adjusts the DC-to-DC power converter 2112 to maintain the input current $I_{LOAD}$ to have the same phase as the output voltage $V_{OUT}$ in a Power Factor Correction (PFC) control mode.

Figure 22:
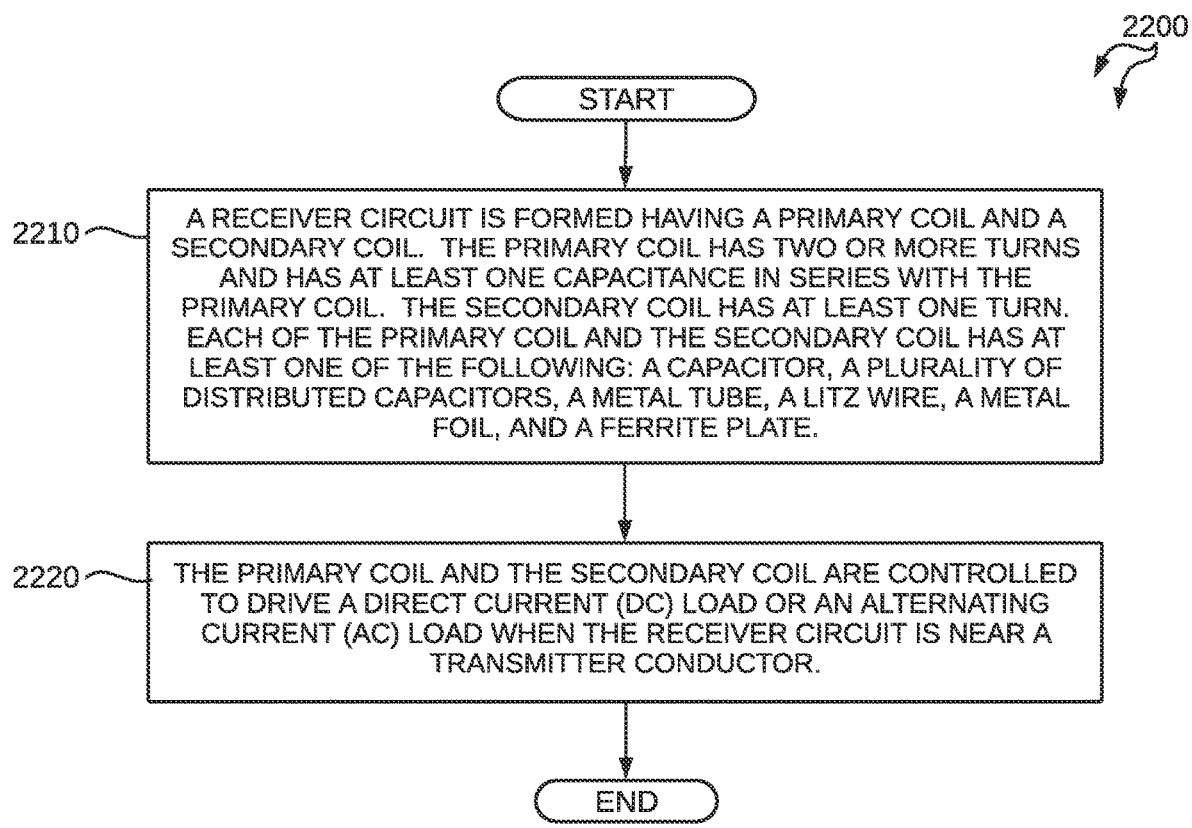
FIG. 22 is a flowchart of a method 2200 in accordance with another novel aspect.

FIG. 22 is a flowchart of a method 2200 in accordance with at least one novel aspect. In a first step (step 2210), a receiver circuit is formed having a primary coil and a secondary coil. The primary coil has two or more turns and has at least one capacitance in series with the primary coil. The secondary coil has at least one turn. Each of the primary coil and the secondary coil has at least one of the following: a capacitor, a plurality of distributed capacitors, a metal tube, a Litz wire, a metal foil, and a ferrite plate. In a second step (step 2220), the primary coil and the secondary coil are controlled to drive a DC load or an AC load when the receiver circuit is near a transmitter conductor.

Although certain specific embodiments are described above for instructional purposes, the teachings of this patent document have general applicability and are not limited to the specific embodiments described above. For additional information on how to construct and operate the OLRM control circuitry to drive the inverters to perform reactance matching during wireless power transmission, see: U.S. Provisional Patent Application Ser. No. 62/909,854 filed on Oct. 3, 2019, the entire subject matter of which is incorporated herein by reference. Accordingly, various modifications, adaptations, and combinations of various features of the described embodiments can be practiced without departing from the scope of the invention as set forth in the claims.

What is claimed is:

1. A receiver circuit comprising:
   a primary coil having two or more turns, wherein the primary coil comprises at least one capacitance in series with the primary coil, and wherein the primary coil forms a connected loop and has no open ends; and
   a secondary coil having at least one turn, wherein the secondary coil drives a Direct Current (DC) load or Alternating Current (AC) load.

2. The receiver circuit of claim 1, further comprising:
   a ferrite plate, wherein the primary coil and the secondary coil are disposed adjacent to the ferrite plate.

3. The receiver circuit of claim 1, wherein each of the primary coil and the secondary coil comprises at least one element taken from the group consisting of: a capacitor, a plurality of distributed capacitors, a metal tube, a Litz wire, a metal foil, and a ferrite plate.

4. The receiver circuit of claim 1, wherein the secondary coil is a two-turns coil having a first end and a second end, wherein the receiver circuit further comprises:
   a first diode coupled to a first end of the secondary coil; and
   a second diode coupled to a second end of the secondary coil, wherein the secondary coil drives a DC load via the first diode and the second diode.

5. The receiver circuit of claim 1, wherein the primary coil further comprises a variable capacitor.

6. The receiver circuit of claim 5, further comprising:
   a controller, wherein the controller controls a capacitance of the variable capacitor.

7. The receiver circuit of claim 6, further comprising:
   a magnetic field sensor coupled to the controller, wherein the magnetic field sensor detects a magnetic field of a transmitter circuit; and
   a voltage sensor coupled to the controller, wherein the voltage sensor detects an output voltage of the secondary coil, and wherein the controller controls the capacitance of the variable capacitor based on the magnetic field and the output voltage such that the magnetic field and the output voltage are in phase.

8. The receiver circuit of claim 6, further comprising:
   a transformer coupled to receive an output voltage supplied by the secondary coil; and
   a rectifier.

9. The receiver circuit of claim 8, further comprising:
   a Direct Current to Direct Current (DC-to-DC) power converter, wherein the DC-to-DC power converter is coupled to the transformer; and
   a current sensor coupled to the controller, wherein the current sensor detects a current output by the rectifier, and wherein the controller controls the DC-to-DC power converter to achieve a unit power factor using the current output detected by the current sensor.

10. The receiver circuit of claim 1, wherein the receiver circuit is part of a stationary or moving device.

11. The receiver circuit of claim 1, wherein the receiver circuit is part of a vehicle or drone.

12. A method comprising:
   forming a receiver circuit having a primary coil and a secondary coil, wherein the primary coil has two or more turns and has at least one capacitance in series with the primary coil, wherein the primary coil forms a connected loop and has no open ends, and wherein the secondary coil has at least one turn.

13. The method of claim 12, wherein each of the primary coil and the secondary coil comprises at least one element taken from the group consisting of: a capacitor, a plurality of distributed capacitors, a metal tube, a Litz wire, a metal foil, and a ferrite plate.

14. The method of claim 12, further comprising:
   controlling the primary coil and the secondary coil to drive a Direct Current (DC) load or an Alternating Current (AC) load when the receiver circuit is near a transmitter conductor.

15. The method of claim 12, wherein the secondary coil has two turns, wherein the secondary coil has a first end and a second end, and wherein the method further comprises:
   coupling the first end of the secondary coil to a first diode and coupling the second end of the secondary coil to a second diode; and
   supplying a DC load via the first diode and the second diode.

16. The method of claim 12, further comprising:
   providing a ferrite plate adjacent to the primary coil and the secondary coil.

17. The method of claim 12, wherein the capacitance is provided by a variable capacitor, and wherein the method further comprises:
   detecting a magnetic field of a transmitter circuit that wirelessly supplies the receiver circuit;
   detecting a voltage output by the secondary coil of the receiver circuit; and
   adjusting the capacitance of the variable capacitor based on the magnetic field and the voltage.

18. The method of claim 17, further comprising:
supplying voltage output by the secondary coil of the receiver circuit to a rectifier via a transformer;
detecting a rectifier current output by the rectifier circuit; and
supplying the rectifier current to a Direct Current to Direct Current (DC-to-DC) power converter, wherein the DC-to-DC power converter is controlled to achieve a unit power factor based in part on the rectifier current.

19. The method of claim 12, further comprising:
including the receiver circuit as part of a stationary or moving device.

20. The method of claim 12, further comprising:
including the receiver circuit as part of a vehicle or drone.

21. A receiver circuit comprising:
a primary coil disposed near a secondary coil, wherein the primary coil has two or more turns and the secondary coil has at least one turn with a variable capacitor in series with the primary coil, and wherein the primary coil forms a connected loop and has no open ends; and
means for controlling a capacitance of the variable capacitor.

22. The receiver circuit of claim 21, wherein the means for controlling the capacitance is a control circuit.

23. The receiver circuit of claim 21, wherein each of the primary coil and the secondary coil comprises at least one element taken from the group consisting of: a capacitor, a plurality of distributed capacitors, a metal tube, a Litz wire, a metal foil, and a ferrite plate.

24. The receiver circuit of claim 21, wherein the means is also for maintaining an output voltage of the secondary coil in phase with a magnetic field of a transmitter circuit.

* * * * *